(12) United States Patent
Hatakeyama et al.

(10) Patent No.: US 6,455,223 B1
(45) Date of Patent: Sep. 24, 2002

(54) RESIST COMPOSITIONS AND PATTERNING PROCESS

(75) Inventors: Jun Hatakeyama; Tomohiro Kobayashi; Osamu Watanabe; Takanobu Takeda; Toshinobu Ishihara; Jun Watanabe, all of Nakakubiki-gun (JP)

(73) Assignee: Shin-Etsu Chemical Co., Ltd. (JP)

( * ) Notice: Subject to any disclaimer, the term of this patent is extended or adjusted under 35 U.S.C. 154(b) by 0 days.

(21) Appl. No.: 09/534,351

(22) Filed: Mar. 24, 2000

(30) Foreign Application Priority Data

Mar. 26, 1999 (JP) ............................................. 11-082885

(51) Int. Cl.7 .............................................. G03F 7/039
(52) U.S. Cl. .................................... 430/270.1; 430/905
(58) Field of Search ............................... 430/270.1, 905

(56) References Cited

U.S. PATENT DOCUMENTS

| 4,491,628 A | | 1/1985 | Ito et al. | |
|---|---|---|---|---|
| 4,939,229 A | * | 7/1990 | Bogan, Jr. | .................. 528/144 |
| 5,587,446 A | | 12/1996 | Frechet et al. | .............. 526/333 |
| 5,891,603 A | * | 4/1999 | Kodama et al. | .......... 430/270.1 |
| 5,942,367 A | * | 8/1999 | Watanabe et al. | ........... 430/170 |
| 6,027,854 A | * | 2/2000 | Nishi et al. | ............... 430/270.1 |
| 6,136,502 A | * | 10/2000 | Satoshi et al. | ........... 430/270.1 |

FOREIGN PATENT DOCUMENTS

| EP | 0 397 460 | 11/1990 |
|---|---|---|
| EP | 0 399 691 | 11/1990 |
| EP | 0 908 473 | 4/1999 |
| JP | 63-27829 | 2/1988 |
| JP | 2-27660 | 6/1990 |
| JP | 6-266099 | 9/1994 |
| WO | 99 03898 | 1/1999 |

OTHER PUBLICATIONS

English Abstract for 63–27829.
English Abstract for 6–266099.
Derwent World Patent Index Abstracts JP 11 029617 (Nippon Soda Co.) Feb. 2, 1999.

* cited by examiner

*Primary Examiner*—John S. Chu
(74) *Attorney, Agent, or Firm*—Millen, White, Zelano & Branigan, P.C.

(57) ABSTRACT

A resist composition comprising a dendritic or hyperbranched polymer of a phenol derivative having a weight average molecular weight of 500–10,000,000 has an excellent resolution, reduced line edge roughness, and dry etching resistance and is useful as a chemical amplification type resist composition which may be either positive or negative working.

14 Claims, No Drawings

RESIST COMPOSITIONS AND PATTERNING PROCESS

This invention relates to novel resist compositions suited for microfabrication technology and a patterning process.

BACKGROUND OF THE INVENTION

While a number of recent efforts are being made to achieve a finer pattern rule in the drive for higher integration and operating speeds in LSI devices, deep-ultraviolet lithography is thought to hold particular promise as the next generation in microfabrication technology. Deep-UV lithography is capable of achieving a minimum feature size of 0.3 μm or less and, when a resist having low light absorption is used, can form patterns with sidewalls that are nearly perpendicular to the substrate. One technology that has attracted a good deal of attention recently utilizes a high-intensity KrF excimer laser as the deep-UV light source. Resist materials with low light absorption and high sensitivity are needed to successfully apply this technology to large-volume production.

Acid-catalyzed chemically amplified resist materials which were recently developed from this standpoint are disclosed in JP-B 2-27660, JP-A 63-27829, U.S. Pat. Nos. 4,491,628 and 5,310,619. These resist materials are especially promising for deep-UV lithography because of their excellent properties such as high sensitivity and high resolution. They are known to exhibit excellent properties when exposed to electron beams (EB) and x-rays.

Chemically amplified resist materials were initially utilized in the 0.3 micron process. By way of 0.25 micron rule, their application to 0.18 micron rule for mass scale production is now started, and even their further application to 0.15 micron rule is under consideration. The evolution of KrF excimer laser lithography toward finer pattern rules is accelerating. At the same time, an actual study on the use of EB or x-ray as the light source is started, with the target placed on the next generation of microfabrication. It is required to miniaturize the pattern rule and improve the resolution of resist material.

With the progress of miniaturization, line edge roughness is now taken serious. The line edge roughness, also known as micro-roughness, represents irregularities on the side wall of a line. Upon exposure to light of a single wavelength as in the case of an excimer laser, reflection from the substrate produces standing waves, which cause irregularities to generate on the side walls. The reflection from the substrate can be suppressed to substantially 0% by disposing an anti-reflection film between the resist and the substrate, but line roughness is still observed. In the case of EB and x-ray exposure, no standing waves generate due to the lack of reflection from the substrate, but line edge roughness is yet observed. It is believed in the literature that the line edge roughness is assigned to polymer clusters. JP-A 6-266099 describes that the line edge roughness can be reduced by using low molecular weight monodisperse polymers. It is also known that line edge roughness occurs more often in negative resists than in positive resists. However, the use of low molecular weight polymers has the drawbacks associated with their low glass transition temperature (Tg). If the Tg is lower than the pre-baking temperature, heat baking must be avoided, which is impractical. Further the lower Tg of polymers leads to a decline of dry etching resistance.

SUMMARY OF THE INVENTION

An object of the invention is to provide a novel and improved resist composition having a high resolution, high sensitivity, minimized line edge roughness and satisfactory dry etching resistance. Another object of the invention is to provide a process for forming a resist pattern using the resist composition.

We have found that while the entanglement of polymer molecules is believed to constitute a cluster structure, the intensity of entanglement is in proportion to the length of the polymer backbone. When a branched polymer, and especially a star-shaped polymer having more uniformly distributed branches is used rather than a linear polymer, entanglement occurs only within the length of branches, indicating that the entanglement is mitigated without reducing the overall molecular weight. While radical polymerization is generally believed to induce branching, it is impossible to precisely control the degree of branching during radical polymerization to regulate the molecular weight and its dispersity. We have found that a star-shaped polymer can be synthesized by living anion polymerization and that polymer is applicable as the base resin of resist material.

In a first aspect, the invention provides a resist composition comprising as a base resin a dendritic or hyperbranched polymer of a phenol derivative having a weight average molecular weight of 500 to 10,000,000.

In one preferred embodiment, the polymer comprises recurring units (I) or (II) or both and recurring units (III) as shown below, the number of units (III) being 1 to 1,000.

units (I):

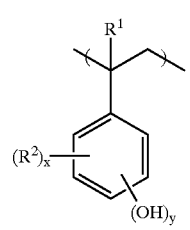

(1)

units (II):

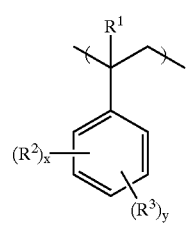

(2)

Herein $R^1$ is hydrogen or methyl, $R^2$ is independently a straight, branched or cyclic alkyl group of 1 to 30 carbon atoms or aryl group of 6 to 30 carbon atoms, $R^3$ is an $OR^4$ group, $R^4$ is an acid labile group or acid stable group, x is 0 or a positive integer, y is a positive integer, and the sum of x and y is up to 5.

units (III):

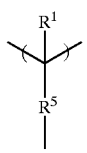

(3)

Herein $R^1$ is as defined above, and $R^5$ is a straight, branched or cyclic alkylene group of 1 to 30 carbon atoms or arylene group of 6 to 30 carbon atoms, or a mixture thereof, which may contain an ether or ester bond. Preferably, the units (III) are of the following formula (3a):

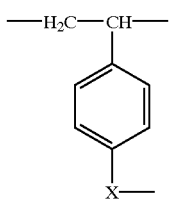

(3a)

wherein X is a valence bond or a straight or branched alkylene group of 1 to 10 carbon atoms which may contain a hydroxyl or carbonyl group. Typically, the polymer has been prepared by living anion polymerization.

In a second aspect, the invention provides a chemical amplification type positive resist composition comprising (A) a base resin constructed of the above-defined polymer which is little or no soluble in alkali, but becomes alkali soluble by reaction with acid, (B) an organic solvent, and (C) a photoacid generator. The positive resist composition may further include (D) a basic compound and (E) a dissolution regulator.

In a third aspect, the invention provides a chemical amplification type negative resist composition comprising (A') a base resin constructed of the above-defined polymer which becomes little or no soluble in alkali by crosslinking with a crosslinker, (B) an organic solvent, (C) a photoacid generator, and (F) the crosslinker. The negative resist composition may further include (D) a basic compound.

In a fourth aspect, the invention provides a process for forming a resist pattern comprising the steps of (i) applying the chemical amplification type positive or negative resist composition onto a substrate, (ii) heat treating the coated film and then exposing it to actinic radiation having a wavelength of up to 500 nm or electron beams through a photo mask, and (iii) optionally heat treating the exposed film and developing it with a developer.

DESCRIPTION OF THE PREFERRED EMBODIMENT

Polymer

The resist composition of the invention uses as a base resin a polymer or high molecular weight compound in the form of a dendritic or hyperbranched polymer of a phenol derivative having a weight average molecular weight of 500 to 10,000,000.

Preferably the polymer is comprised of recurring units (I) and/or recurring units (II) and recurring units (III). The number of units (III) is 1 to 1,000, more preferably 1 to 500, and most preferably 1 to 200.

units (I):

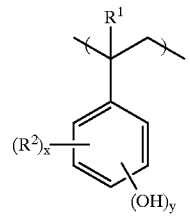

(1)

units (II):

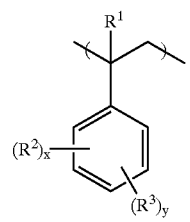

(2)

Herein $R^1$ is hydrogen or methyl, $R^2$, which may be the same or different, is a straight, branched or cyclic alkyl group of 1 to 30 carbon atoms or aryl group of 6 to 30 carbon atoms, $R^3$ is an $OR^4$ group, $R^4$ is an acid labile group or acid stable group, x is 0 or a positive integer, y is a positive integer, satisfying $x+y \leq 5$.

units (III):

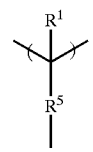

(3)

Herein $R^1$ is as defined above, and $R^5$ is a straight, branched or cyclic alkylene group of 1 to 30 carbon atoms or arylene group of 6 to 30 carbon atoms, or a mixture thereof, which may contain an ether or ester bond.

More preferably, the units (III) are of the following formula (3a):

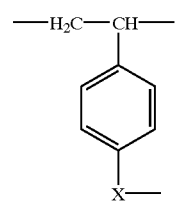

(3a)

wherein X is a valence bond or a straight or branched alkylene group of 1 to 10 carbon atoms which may contain a hydroxyl or carbonyl group.

More illustratively, $R^2$ represents straight, branched or cyclic alkyl groups or aryl groups of 1 to 30 carbon atoms, preferably 1 to 15 carbon atoms, more preferably 1 to 8 carbon atoms. Exemplary of the straight, branched or cyclic alkyl groups are methyl, ethyl, propyl, isopropyl, n-butyl, isobutyl, tert-butyl, cyclohexyl, cyclopentyl. Phenyl is an exemplary aryl group.

The acid labile group represented by $R^4$ may be selected from a variety of acid labile groups, preferably from groups of the following formulas (9) and (10), tert-alkyl groups of 4 to 40 carbon atoms, trialkylsilyl groups whose alkyl groups each have 1 to 6 carbon atoms, and oxoalkyl groups of 4 to 20 carbon atoms.

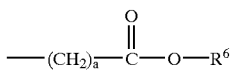
(9)

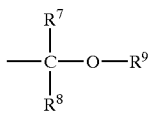
(10)

In formula (9), $R^6$ is selected from tert-alkyl groups of 4 to 40 carbon atoms, trialkylsilyl groups whose alkyl groups each have 1 to 6 carbon atoms, and oxoalkyl groups of 4 to 20 carbon atoms, and a is an integer of 0 to 10. In formula (10), $R^7$ is hydrogen or a straight, branched or cyclic alkyl group having 1 to 10 carbon atoms, and $R^8$ and $R^9$ are independently selected from straight, branched or cyclic alkyl groups having 1 to 10 carbon atoms, or $R^8$ and $R^9$, taken together, form a ring.

Examples of the acid labile group of formula (10) include straight or branched acetal groups such as 1-methoxyethyl, 1-ethoxyethyl, 1-n-propoxyethyl, 1-isopropoxyethyl, 1-n-butoxyethyl, 1-isobutoxyethyl, 1-sec-butoxyethyl, 1-tert-butoxyethyl, 1-tert-amyloxyethyl, 1-ethoxy-n-propyl, 1-cyclohexyloxyethyl, methoxypropyl, ethoxypropyl, 1-methoxy-1-methylethyl, and 1-ethoxy-1-methylethyl; and cyclic acetal groups such as tetrahydrofuranyl and tetrahydropyranyl, with the ethoxyethyl, butoxyethyl and ethoxypropyl groups being preferred. Examples of the acid labile group of formula (9) include tert-butoxycarbonyl, tert-butoxycarbonylmethyl, tert-amyloxycarbonyl, tert-amyloxycarbonylmethyl, 1-ethoxyethoxycarbonylmethyl, 2-tetrahydropyranyloxycarbonylmethyl, and 2-tetrahydrofuranyloxycarbonylmethyl groups.

Examples of the tertiary alkyl group include tertbutyl, triethylcarbyl, 1-ethylnorbornyl, 1-methylcyclohexyl, 2-(2-methyl)adamantyl and tert-amyl groups.

Examples of the trialkylsilyl group include those wherein alkyl moieties each have 1 to 6 carbon atoms such as trimethylsilyl, triethylsilyl and dimethyl-tert-butylsilyl groups.

A typical oxoalkyl group is 3-oxocyclohexyl.

Also included in the acid labile groups is a crosslinking group Q having a C—O—C linkage. This crosslinking group Q provides intra- or intermolecular crosslinking between OH groups in units (I), as shown below.

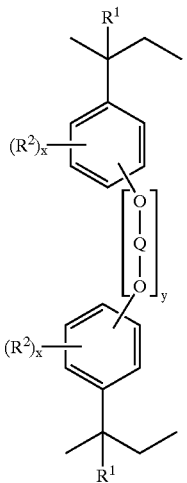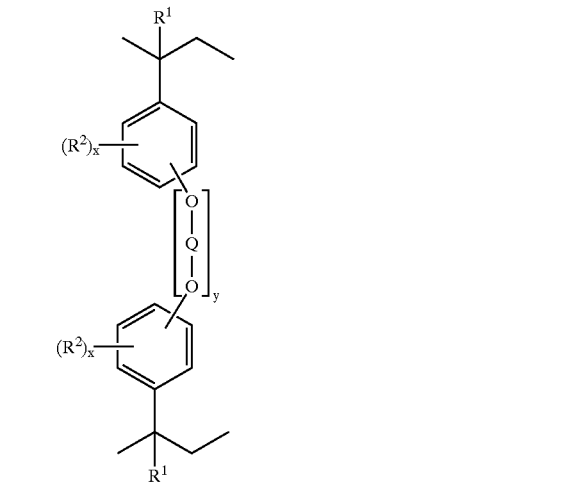

The crosslinking group Q is exemplified by groups of the following general formulas (Qa) and (Qb), preferably formulas (Qa') and (Qb').

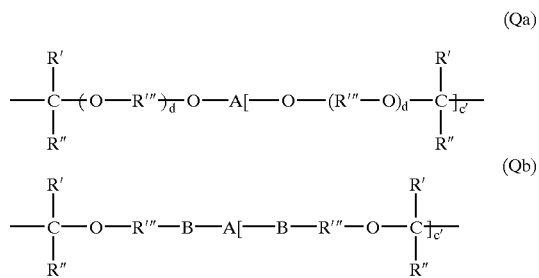

Herein, R' and R" each are hydrogen or a straight, branched or cyclic alkyl group of 1 to 8 carbon atoms, or R' and R", taken together, may form a ring, with the proviso that each of R' and R" is a straight or branched alkylene group of 1 to 8 carbon atoms when they form a ring. R''' is a straight, branched or cyclic alkylene group of 1 to 10 carbon atoms. Letter d is 0 or an integer of 1 to 10. A is a c-valent aliphatic or alicyclic saturated hydrocarbon group, aromatic hydrocarbon group or heterocyclic group of 1 to 50 carbon atoms, which may have an intervening hetero atom and in which the hydrogen atom attached to a carbon atom may be partially replaced by a hydroxyl group, carboxyl group, acyl group or halogen atom. B is —CO—O—, —NHCO—O— or —NHCONH—. Letter c is an integer of 2 to 8, and c' is an integer of 1 to 7.

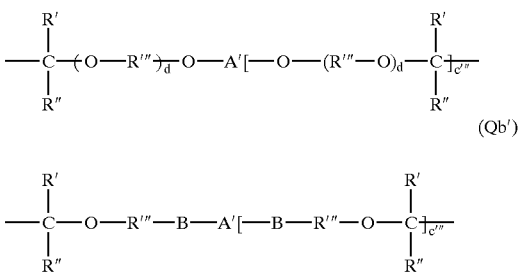

Herein, R' and R' each are hydrogen or a straight, branched or cyclic alkyl group of 1 to 8 carbon atoms, or R' and R", taken together, may form a ring, with the proviso that each of R' and R" is a straight or branched alkylene group of 1 to 8 carbon atoms when they form a ring. R''' is a straight, branched or cyclic alkylene group of 1 to 10 carbon atoms. Letter d is 0 or an integer of 1 to 5. A' is a c''-valent straight, branched or cyclic alkylene, alkyltriyl or alkyltetrayl group of 1 to 20 carbon atoms or an arylene group of 6 to 30 carbon atoms, which may have an intervening hetero atom and in which the hydrogen atom attached to a carbon atom may be partially replaced by a hydroxyl group, carboxyl group, acyl group or halogen atom. B is —CO—O—, —NHCO—O— or —NHCONH—. Letter c'' is an integer of 2 to 4, and c''' is an integer of 1 to 3.

The straight, branched or cyclic alkyl groups of 1 to 8 carbon atoms are as exemplified above. Examples of the straight, branched or cyclic alkylene group of 1 to 10 carbon atoms represented by R''' include methylene, ethylene, propylene, isopropylene, n-butylene, isobutylene, cyclohexylene, and cyclopentylene. Examples of the group represented by A are described later. These crosslinking groups of formulas (Qa) and (Qb) originate from alkenyl ether compounds and halogenated alkyl ether compounds to be described later.

As understood from the value of c' in formula (Qa) or (Qb), the crosslinking group is not limited to a divalent one and trivalent to octavalent groups are acceptable. For example, the divalent crosslinking group is exemplified by groups of the following formulas (Qa'') and (Qb''), and the trivalent crosslinking group is exemplified by groups of the following formulas (Qa''') and (Qb''').

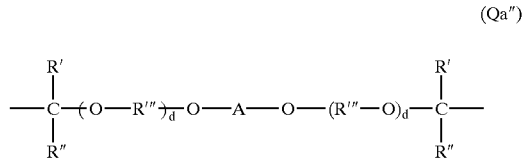

(Qa'')

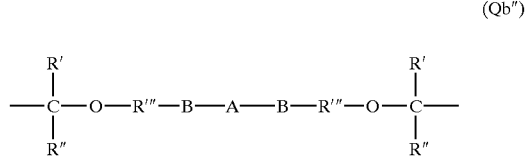

(Qb'')

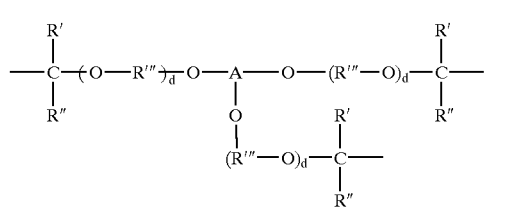

(Qa''')

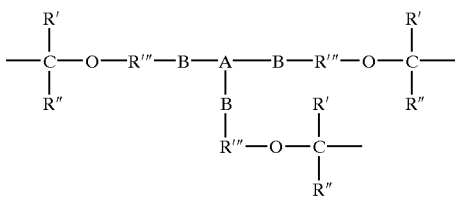

(Qb''')

For introducing the above crosslinking groups, the following compounds may be used.

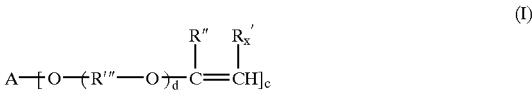

(I)

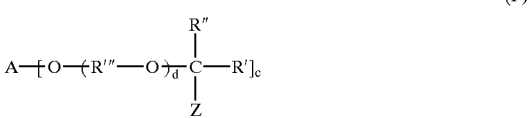

(I')

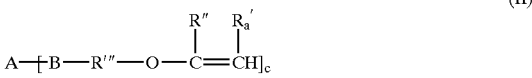

(II)

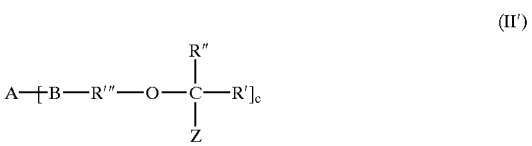

(II')

Herein A, B, R', R", R''', c and d are as defined above, R'$_a$ is hydrogen or a straight, branched or cyclic alkyl group of 1 to 7 carbon atoms, and Z is a halogen atom such as Cl, Br or I.

The c-valent (divalent to octavalent) hydrocarbon groups represented by A include hydrocarbon groups, for example, substituted or unsubstituted alkylene groups having 1 to 50 carbon atoms, especially 1 to 40 carbon atoms, substituted or unsubstituted arylene groups having 6 to 50 carbon atoms, more preferably 6 to 40 carbon atoms, especially 6 to 20 carbon atoms, a combination of an alkylene group and an arylene group, and c'''-valent groups obtained by eliminating one hydrogen atom attached to a carbon atom from the foregoing groups wherein c''' is an integer of 3 to 8; and c-valent heterocyclic groups, and a combination of such a heterocyclic group with any one of the foregoing hydrocarbon groups. In the alkylene and arylene groups, a hetero atom such as O, NH, N(CH$_3$), S and SO$_2$ may intervene and where substituted, the substituent is a hydroxyl, carboxyl, acyl group or a halogen atom such as fluorine, chlorine, bromine or iodine.

Illustrative examples of A are given below.

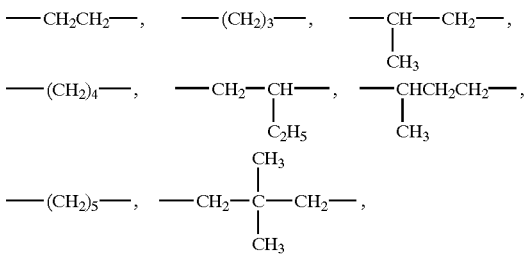

-continued
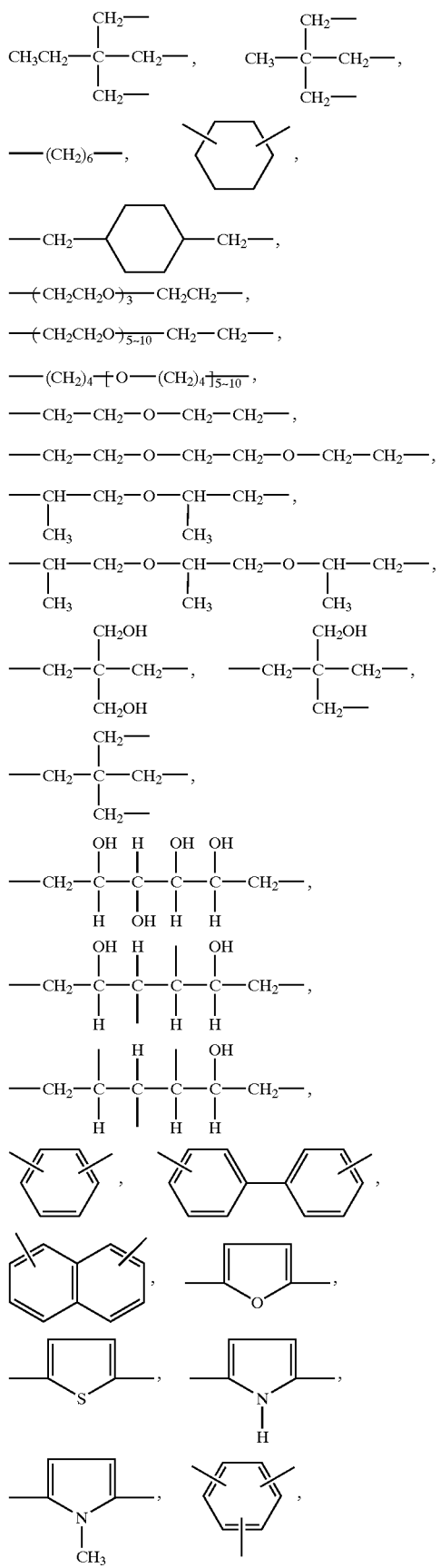
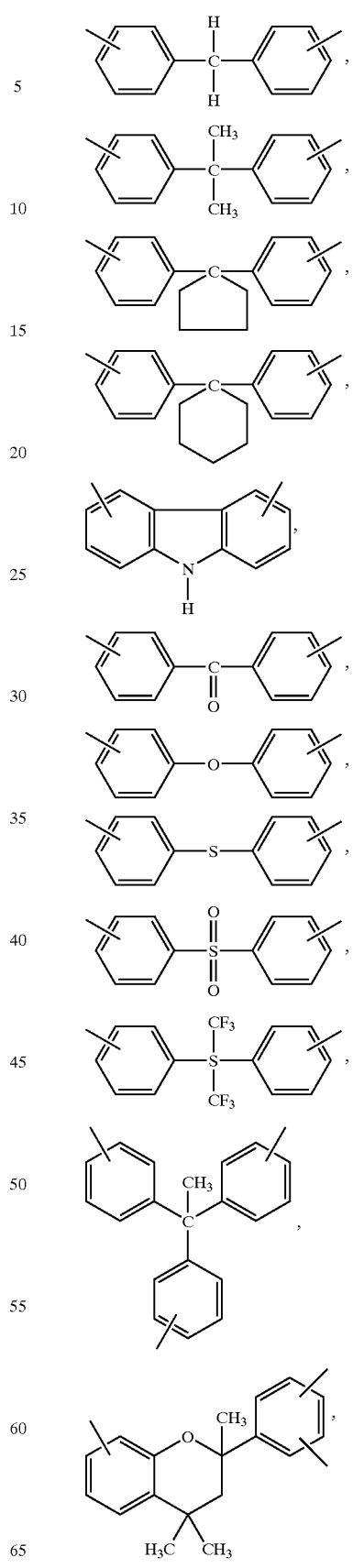

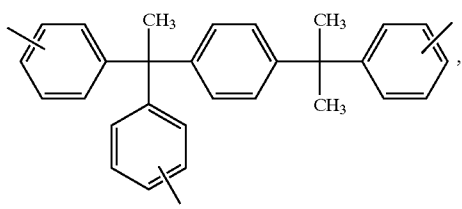

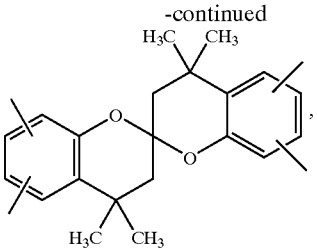

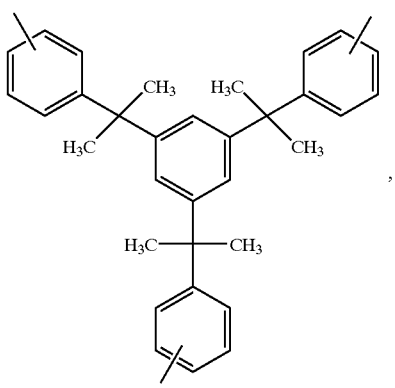

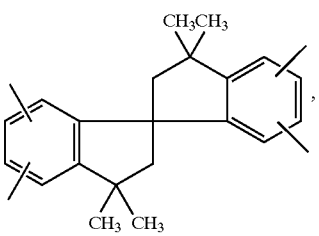

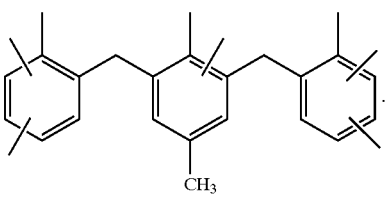

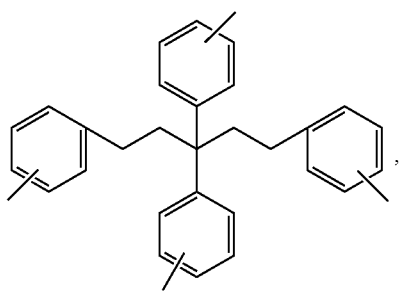

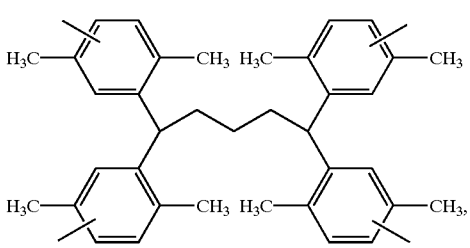

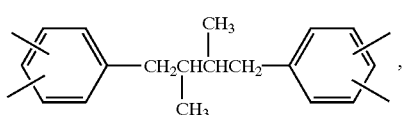

A method as described by Stephen C. Lapin in Polymers Paint Colour Journal, 179 (4237), 321 (1988) may be used to prepare the compounds of general formula (I). This method involves synthesis via the reaction of a polyhydric alcohol or a polyhydric phenol with acetylene, or the reaction of a polyhydric alcohol or polyhydric phenol with a halogenated alkyl vinyl ether.

Illustrative, non-limiting examples of compounds having formula (I) include ethylene glycol divinyl ether, triethylene glycol divinyl ether, 1,2-propanediol divinyl ether, 1,3-propanediol divinyl ether, 1,3-butanediol divinyl ether, 1,4-butanediol divinyl ether, tetramethylene glycol divinyl ether, neopentyl glycol divinyl ether, trimethylolpropane trivinyl ether, trimethylolethane trivinyl ether, hexanediol divinyl ether, 1,4-cyclohexanediol divinyl ether, 1,4-divinyloxymethyl cyclohexane, tetraethylene glycol divinyl ether, pentaerythritol divinyl ether, pentaerythritol trivinyl ether, pentaerythritol tetravinyl ether, sorbitol tetravinyl ether, sorbitol pentavinyl ether, ethylene glycol diethylene vinyl ether, triethylene glycol diethylene vinyl ether, ethylene glycol dipropylene vinyl ether, triethylene glycol diethylene vinyl ether, trimethylolpropane triethylene vinyl ether, trimethylolpropane diethylene vinyl ether, pentaerythritol diethylene vinyl ether, pentaerythritol triethylene vinyl ether, pentaerythritol tetraethylene vinyl ether, and compounds of the formulas (I-1) to (I-31) given below.

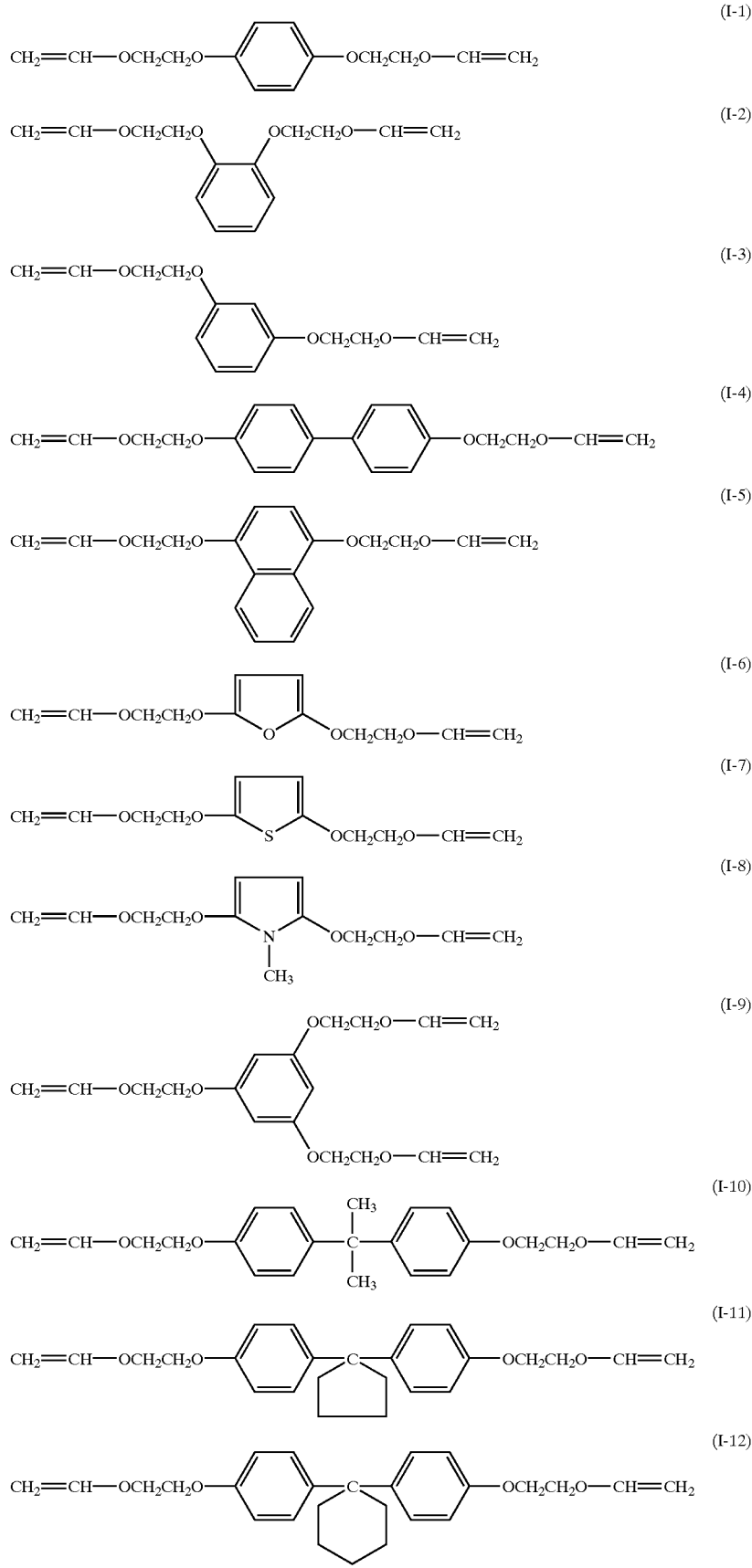

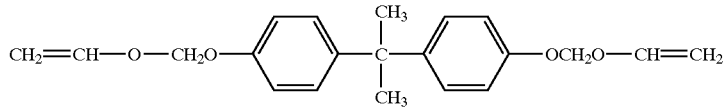 (I-13)
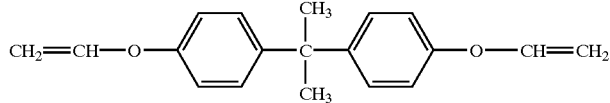 (I-14)
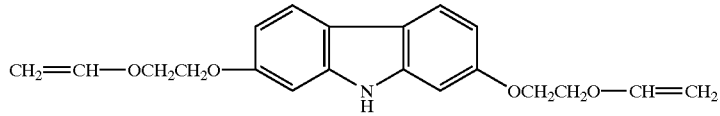 (I-15)
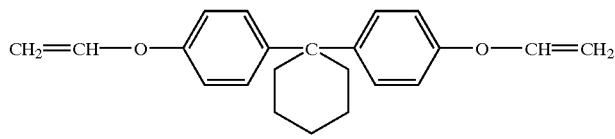 (I-16)
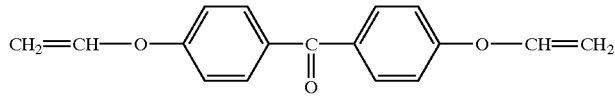 (I-17)
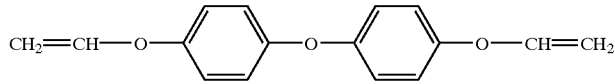 (I-18)
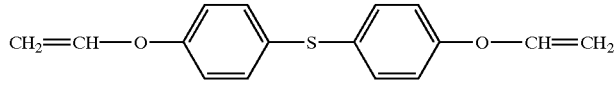 (I-19)
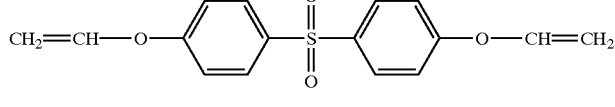 (I-20)
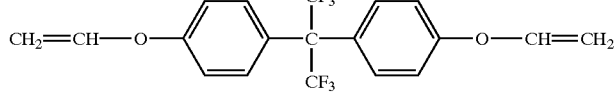 (I-21)
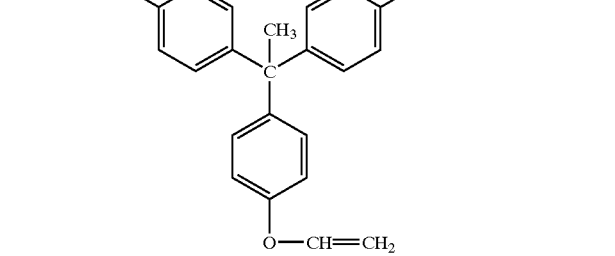 (I-22)
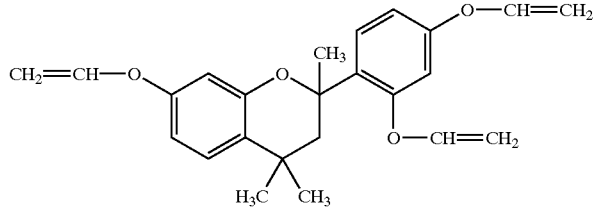 (I-23)

-continued
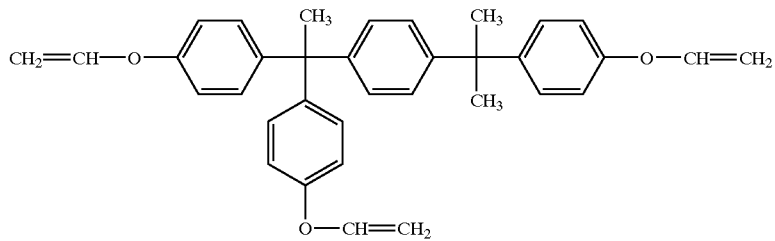 (I-24)
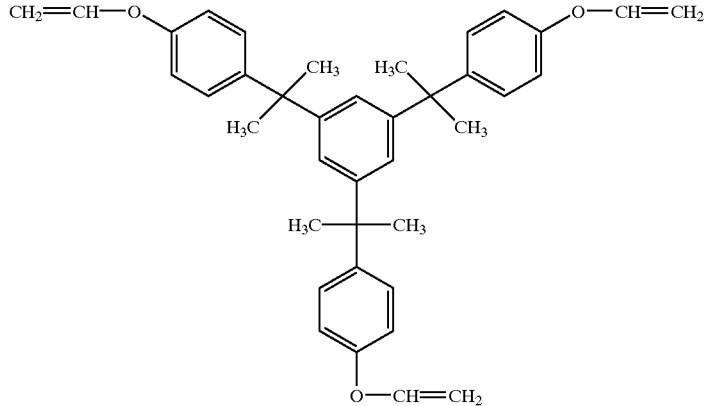 (I-25)
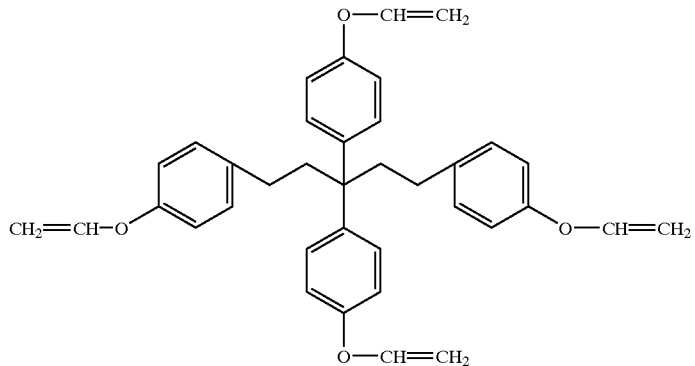 (I-26)
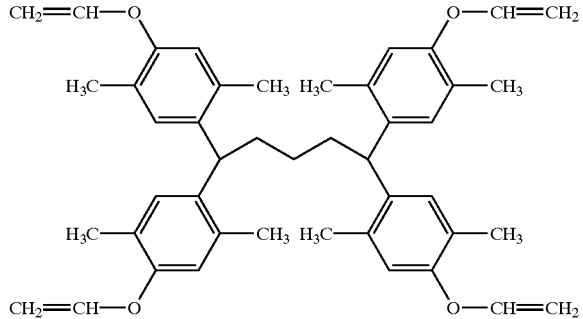 (I-27)
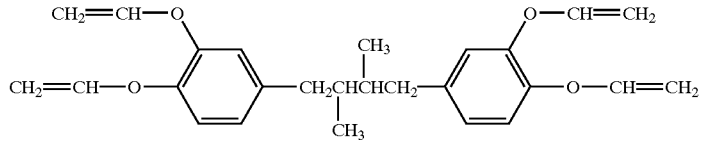 (I-28)

-continued

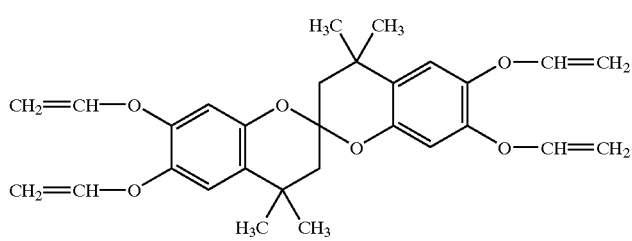
(I-29)

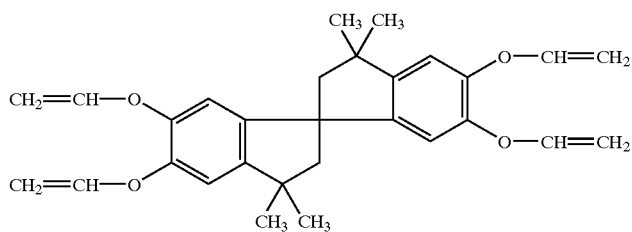
(I-30)

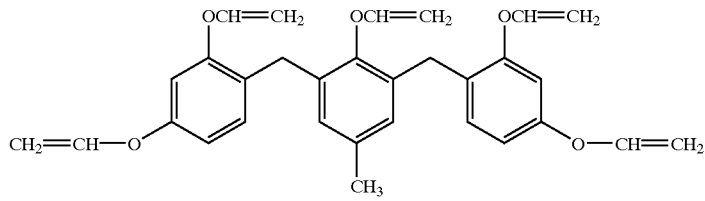
(I-31)

When B is —CO—O—, the compound of general formula (II) above may be prepared by reacting a polycarboxylic acid with a halogenated alkyl vinyl ether. Illustrative, non-limiting examples of compounds having formula (II) in which B is —CO—O— include diethylene vinyl ether terephthalate, diethylene vinyl ether phthalate, diethylene vinyl ether isophthalate, dipropylene vinyl ether phthalate, dipropylene vinyl ether terephthalate, dipropylene vinyl ether isophthalate, diethylene vinyl ether maleate, diethylene vinyl ether fumarate, and diethylene vinyl ether itaconate.

Examples of alkenyl ether group-containing compounds which are highly suitable for use in the invention include alkenyl ether group-containing compounds prepared by reacting an active hydrogen-bearing alkenyl ether compound of general formula (III), (IV), or (V) below, for example, with an isocyanate group-bearing compound.

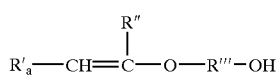
(III)

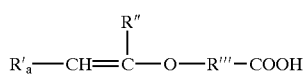
(IV)

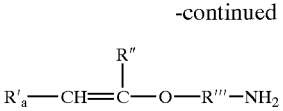
(V)

In these formulas, R'a, R", and R''' are as defined above.

When B is —NHCO—O— or —NHCONH—, examples of the isocyanate group-bearing compound of general formula (II) above which may be used include the compounds mentioned in Handbook of Crosslinking Agents, Taisei K.K., 1981. Illustrative examples include polyisocyanate compounds such as triphenylmethane triisocyanate, diphenylmethane diisocyanate, tolylene diisocyanate, the dimer of 2,4-tolylene diisocyanate, naphthalene-1,5-diisocyanate, o-tolylene diisocyanate, polymethylene polyphenyl isocyanate, and hexamethylene diisocyanate; and polyisocyanate adducts such as the adduct of tolylene diisocyanate and trimethylolpropane, the adduct of hexamethylene diisocyanate and water, and the adduct of xylene diisocyanate and trimethylolpropane. Various compounds with terminal alkenyl ether groups may be obtained by reacting the above-mentioned isocyanate group-bearing compounds with the active hydrogen-bearing alkenyl ether compounds. Illustrative, non-limiting examples of such compounds include those of the following formulas (II-1) to (II-11).

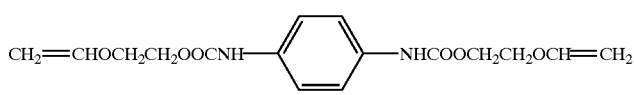
(II-1)

-continued

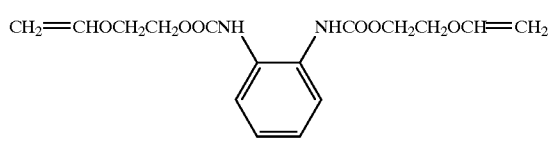
(II-2)

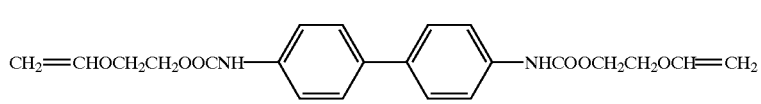
(II-3)

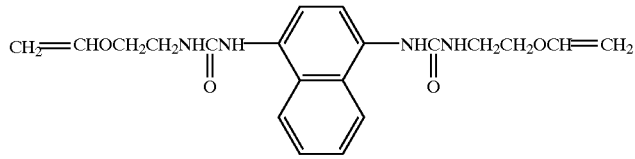
(II-4)

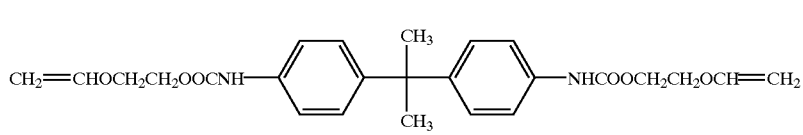
(II-5)

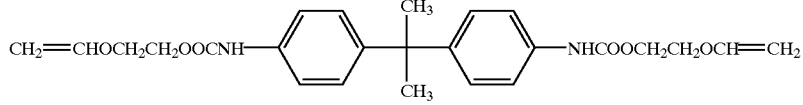
(II-6)

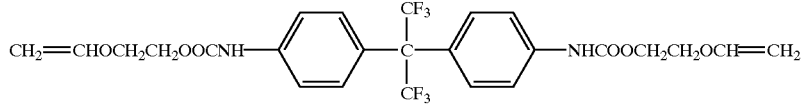
(II-7)

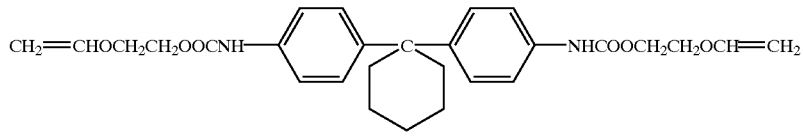
(II-8)

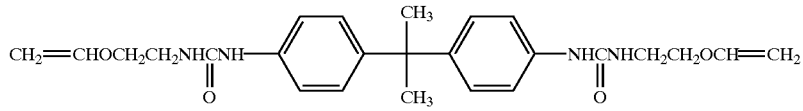
(II-9)

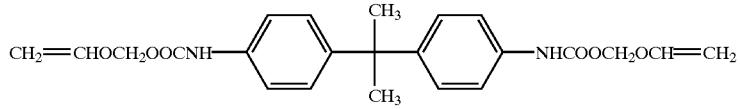
(II-10)

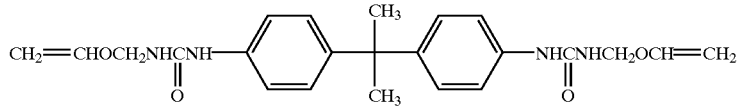
(II-11)

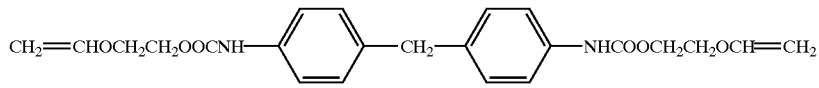

The acid stable group represented by $R^4$ designates a substituent other than the substituent which is eliminated under the action of an acid to produce a phenol to change a rate of dissolution, and includes primary and secondary alkyl groups, primary and secondary alkoxy groups, primary and secondary alkoxycarbonyl groups, primary, secondary and tertiary alkylcarbonyl groups, and aryl groups. The alkyl and alkoxy groups are preferably those of 1 to 20 carbon atoms, especially 1 to 10 carbon atoms. An exemplary aryl group is phenyl. Illustrative, non-limiting examples include methoxy, ethoxy, propoxy, cyclohexyloxy, acetyl, pivaloyl, methylcarbonate, ethylcarbonate, isopropylcarbonate, and methoxymethoxy.

$R^5$ represents alkylene and arylene groups. The alkylene groups are preferably those of 1 to 20 carbon atoms, especially 1 to 10 carbon atoms. The arylene groups are preferably those of 6 to 20 carbon atoms, especially 6 to 10 carbon atoms. A combination of an alkylene group with an arylene group is also useful. These groups and combinations may have ether or ester bonds therein. Illustrative examples include methylene, ethylene, propylene, butylene, hexylene, cyclohexylene, octylene, phenylene, and combinations of any two or more of these groups, which may be separated by —O—, —CO— or —COO—. Preferred are groups represented by the following formula.

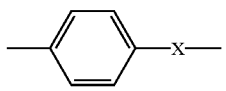

Herein, X is a valence bond or a straight or branched alkylene group of 1 to 10 carbon atoms, preferably 1 to 8 carbon atoms, more preferably 1 to 6 carbon atoms, which may contain a hydroxyl or carbonyl group. Examples of the alkylene group are the same as exemplified above.

The polymer of the invention is a macromolecule which is branched and concatenated in the dendritic or hyperbranched manner that recurring units (I) and/or (II) at one of their two bond sites are attached to the three bond sites of one unit (III) and at the other of their two bond sites to the three bond sites of another unit (III).

The recurring units (I) and (II) are combined such that (II)/[(I)+(II)] may range from 0 to 1. In the case of positive resist compositions, the value of (II)/[(I)+(II)] preferably ranges from 0 to 0.8, more preferably from 0.15 to 0.6, and further preferably from 0.2 to 0.5. In the case of negative resist compositions, the value of (II)/[(I)+(II)] preferably ranges from 0 to 0.8, more preferably from 0 to 0.6, and further preferably from 0 to 0.5.

More illustratively, the polymer of the invention is represented by the following formula (A).

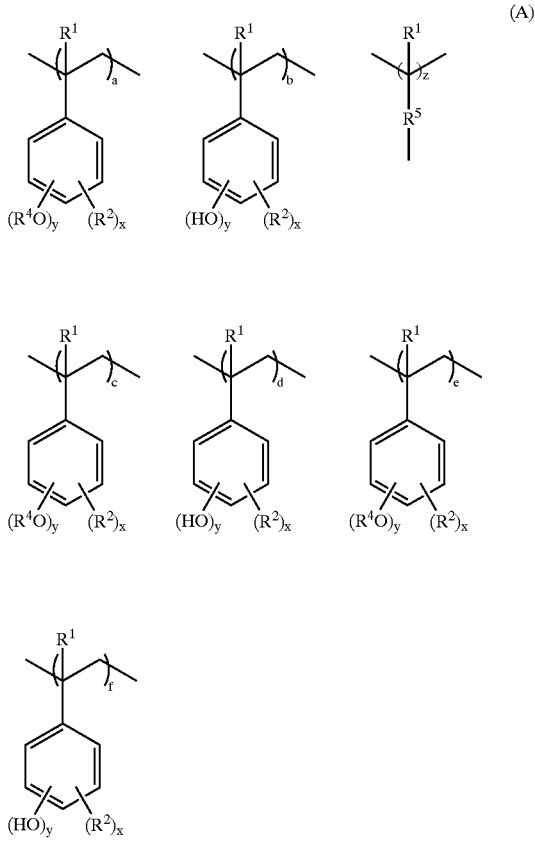

Depending on the value of z representing the number of recurring units (III) wherein z varies with the number of branches, preferably from 1 to 1,000, more preferably from 1 to 100, and most preferably 1 to 50, recurring units "a" and "a", recurring units "c" and "d", and recurring units "e" and "f" are attached to the three bond sites of each recurring unit (III).

$R^1$, $R^2$, $R^4$, and $R^5$ are as defined above, and x and y are as defined above.

The letters "a" to "f" are 0 or positive numbers, with the proviso that each pair of "a" and "a", "c" and "d", and "e" and "f" are not equal to 0 at the same time. The values of a/(a+b), c/(c+d), e/(e+f), and (a+c+e)/(a+b+c+d+e+f) range from 0 to 1. The preferred ranges of these values are as described above for (II)/[(I)+(II)]. These values may be identical or different.

In the case of positive resist compositions, the values of a/(a+b), c/(c+d), e/(e+f), and (a+c+e)/(a+b+c+d+e+f) preferably range from 0.1 to 0.8, more preferably from 0.15 to 0.6, and further preferably from 0.2 to 0.5. In the case of negative resist compositions, the values of a/(a+b), c/(c+d), e/(e+f), and (a+c+e)/(a+b+c+d+e+f) preferably range from 0 to 0.8, more preferably up to 0.6, and further preferably up to 0.5.

As previously described, the polymers of the invention have a weight average molecular weight (Mw) of 500 to 10,000,000, preferably 1,000 to 10,000,000, more preferably 1,000 to 100,000, and most preferably 2,000 to 50,000. The molecular weight distribution or dispersity represented by Mw/Mn is preferably from 1.0 to 5.0, more preferably from 1.0 to 3.0, though not critical.

Illustrative examples of the dendritic or hyperbranched polymers of the invention are those having recurring units represented by at least one of the following approximate formulae (4) to (8).

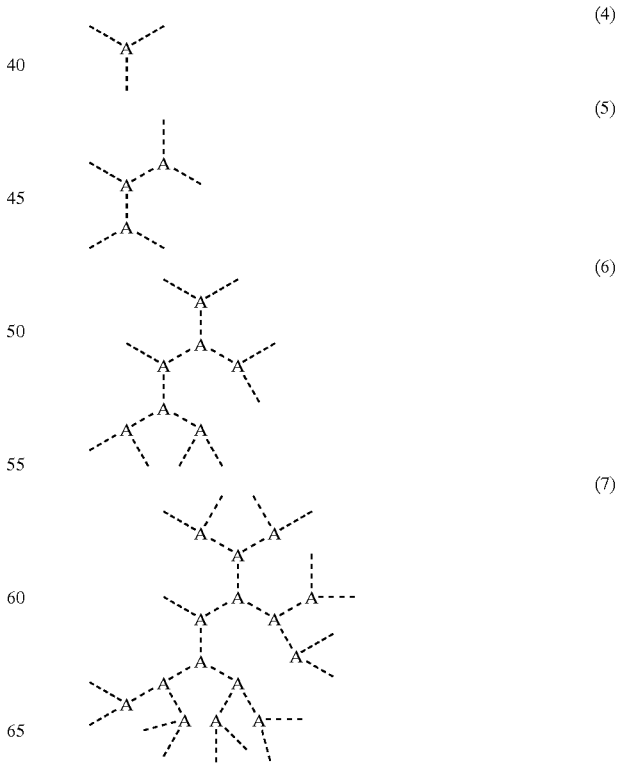

(8)

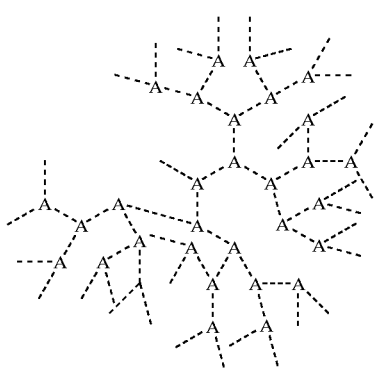

Herein, broken lines represent polymer chains of the recurring units (I) and/or (II), and A represents the units (III). The number of broken line segments between A and A is depicted merely for the sake of convenience, independent of the number of recurring units (I) and (II) included between A and A.

According to the invention, the dendritic or hyperbranched polymer is prepared by effecting living polymerization of a phenol derivative, reacting with a compound having a polymerizable moiety and a terminating moiety and proceeding further polymerization. By repeating this operation, a dendritic or hyperbranched polymer of a phenol derivative can be synthesized. The living polymerization may be effected by any desired technique although living anion polymerization is preferred because of ease of control.

For example, living anion polymerization is initiated using a first monomer of the general formula (i) and/or a second monomer of the general formula (ii). After a predetermined amount of the monomer or monomers is polymerized to form an intermediate, a branching monomer of the general formula (iii) is added and reacted with the intermediate. Then the first monomer of formula (i) and/or the second monomer of formula (ii) are added again and polymerized. This operation is repeated until a desired polymer is obtained.

(i)

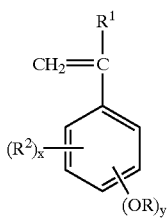

(ii)

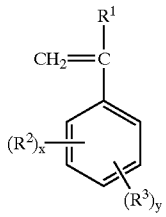

(iii)

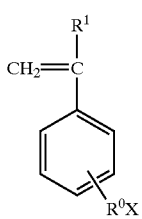

Herein $R^1$, $R^2$, $R^3$, x, and y are as defined above, R is a protective group for a hydroxyl group, $R^0$ is a valence bond or an alkylene group of 1 to 20 carbon atoms, preferably 1 to 10 carbon atoms, and X is a halogen atom, aldehyde group or alkoxycarbonyl group. The protective group represented by R is not critical and may be selected from well-known ones. The protective group can be finally eliminated by a conventional technique.

For living anion polymerization to take place, the reaction solvent is preferably selected from toluene, benzene, tetrahydrofuran, dioxane, and ethyl ether. Of these, polar solvents such as tetrahydrofuran, dioxane, and ethyl ether are preferable. They may be used alone or in admixture of two or more.

The initiator used herein is preferably selected from sec-butyl lithium, n-butyl lithium, naphthalene sodium and cumyl potassium. The amount of the initiator used is proportional to the design molecular weight.

Preferred reaction conditions include a temperature of −80° C. to 100° C., preferably −70° C. to 0° C., and a time of 0.1 to 50 hours, preferably 0.5 to 5 hours.

One exemplary reaction scheme using sec-butyl lithium as the initiator is shown below. The degree of branching can be altered by repeating the reaction desired times.

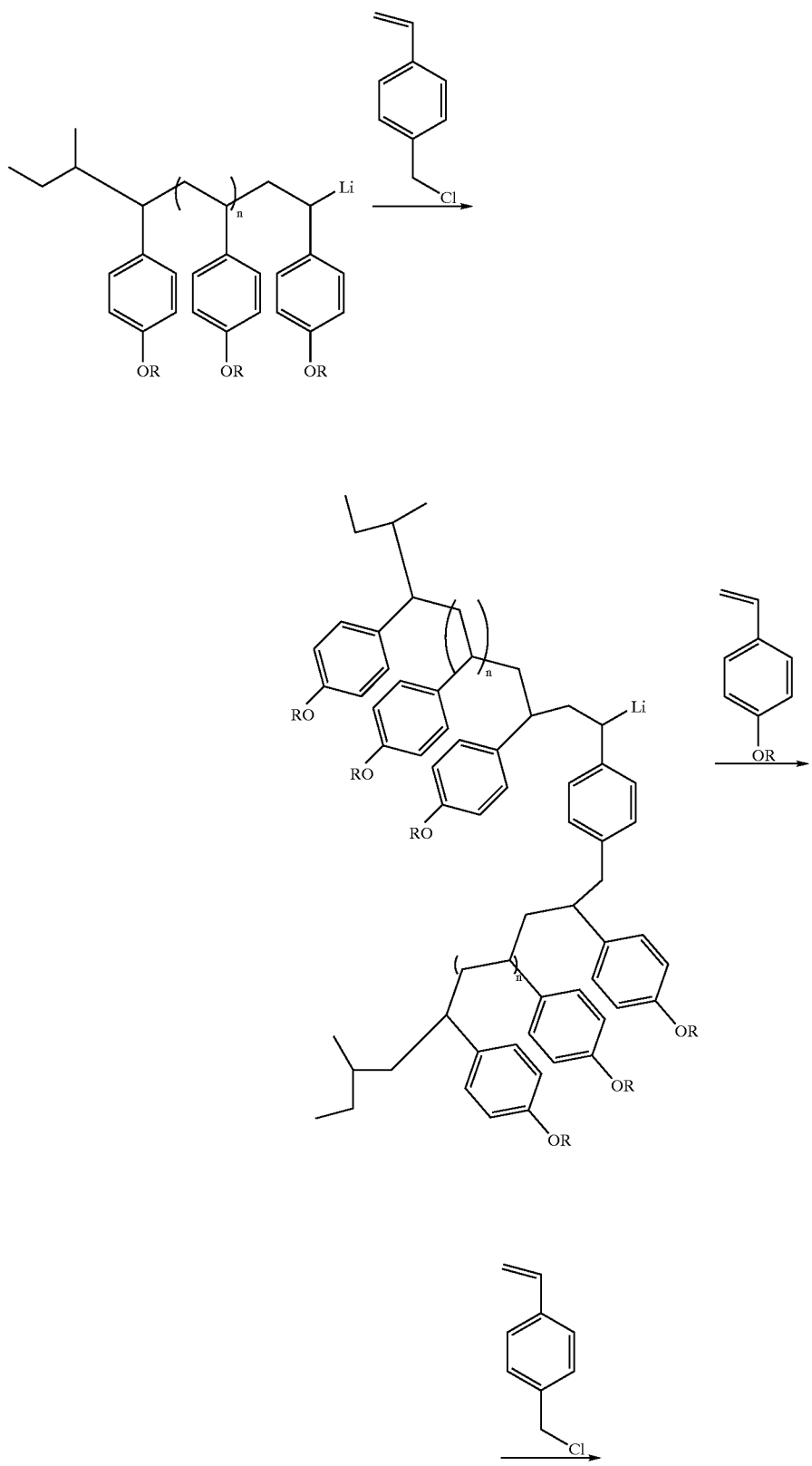

-continued

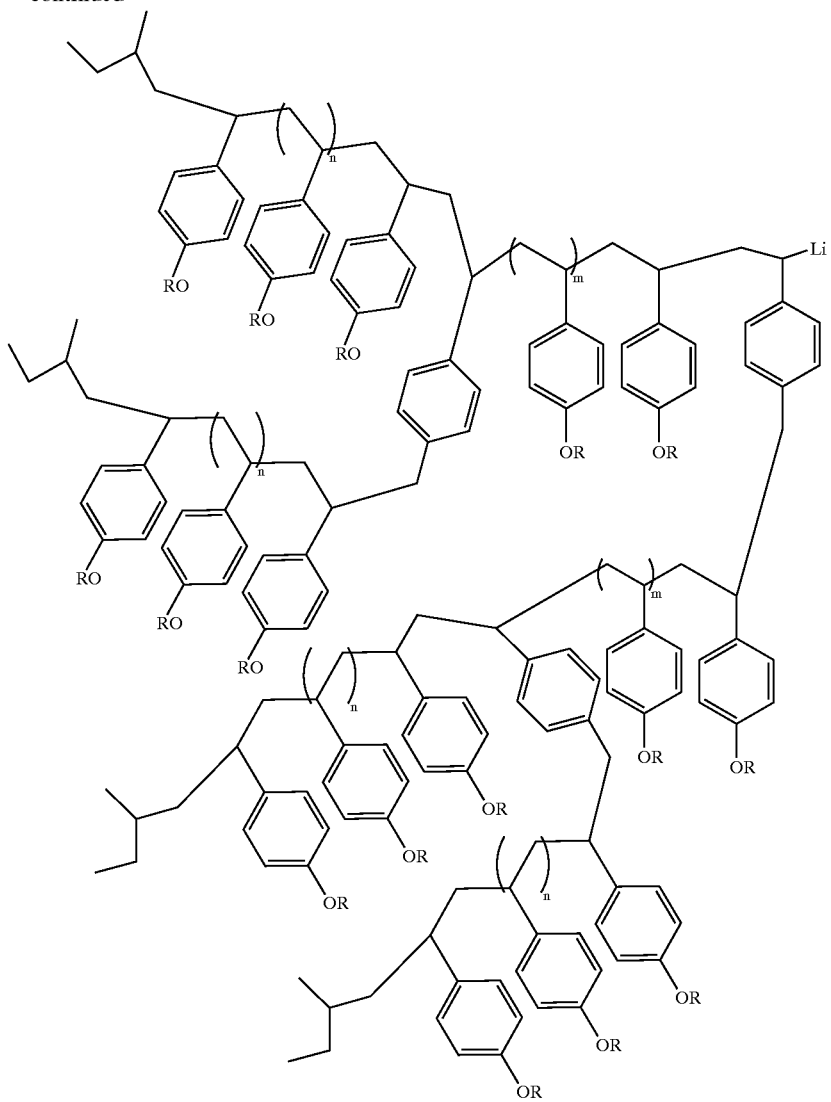

When acid labile groups are to be introduced, the desired acid labile groups may be introduced to the phenolic hydroxyl groups on the resulting poly(p-hydroxystyrene) by a well-known technique. Alternatively, polymerization may be effected as above using a hydroxystyrene derivative monomer having acid labile groups or acid stable groups introduced to its phenolic hydroxyl groups.

One exemplary process entailing the introduction of acid labile groups is shown below.

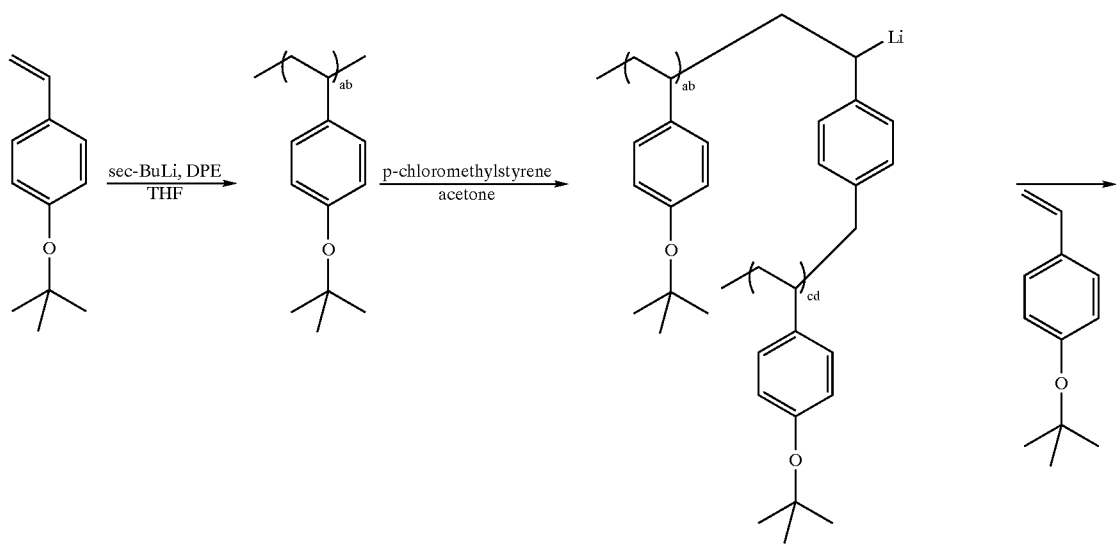
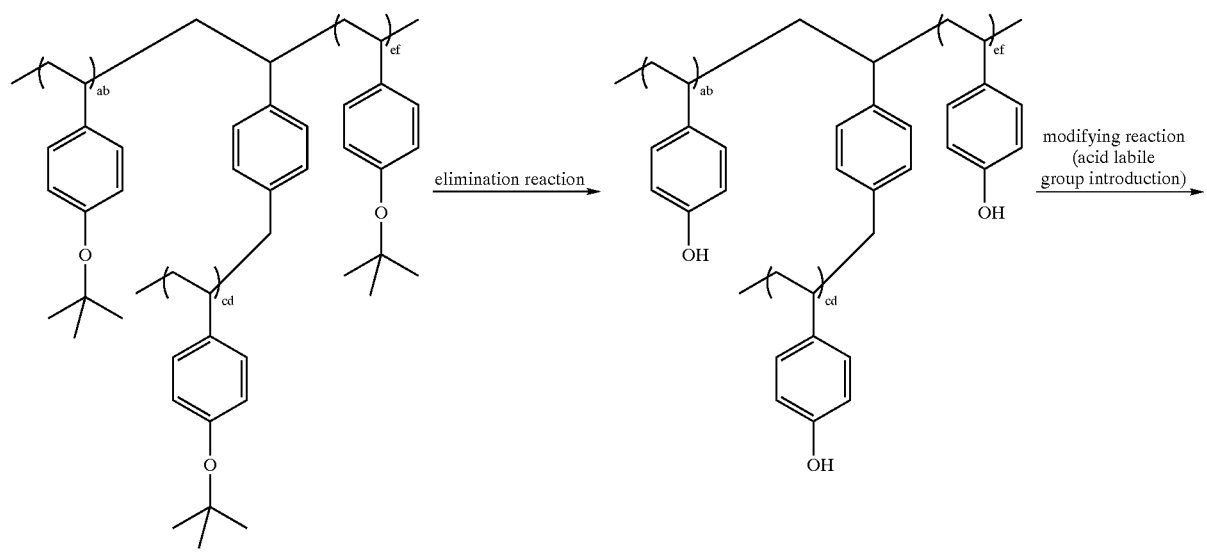

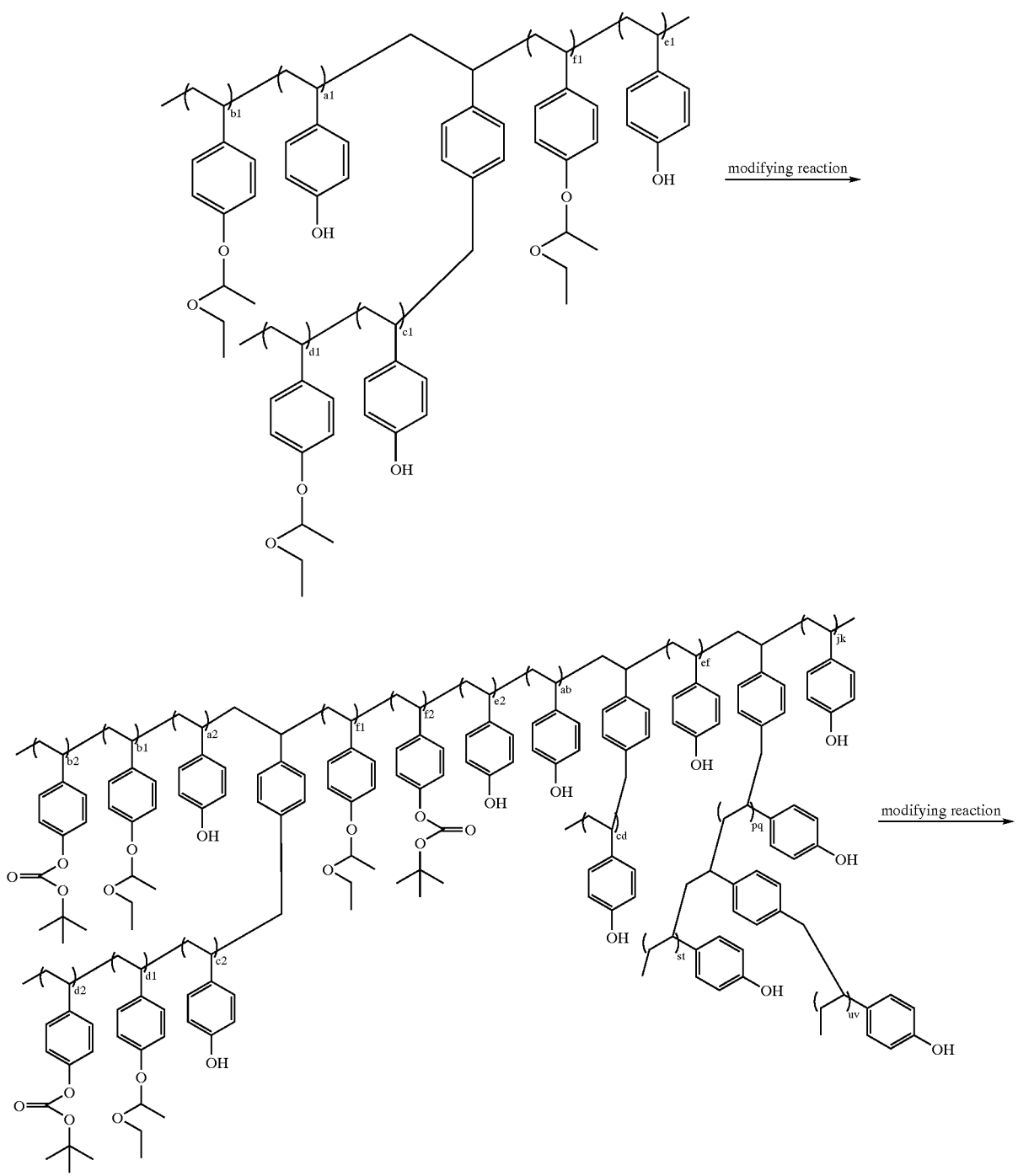

-continued
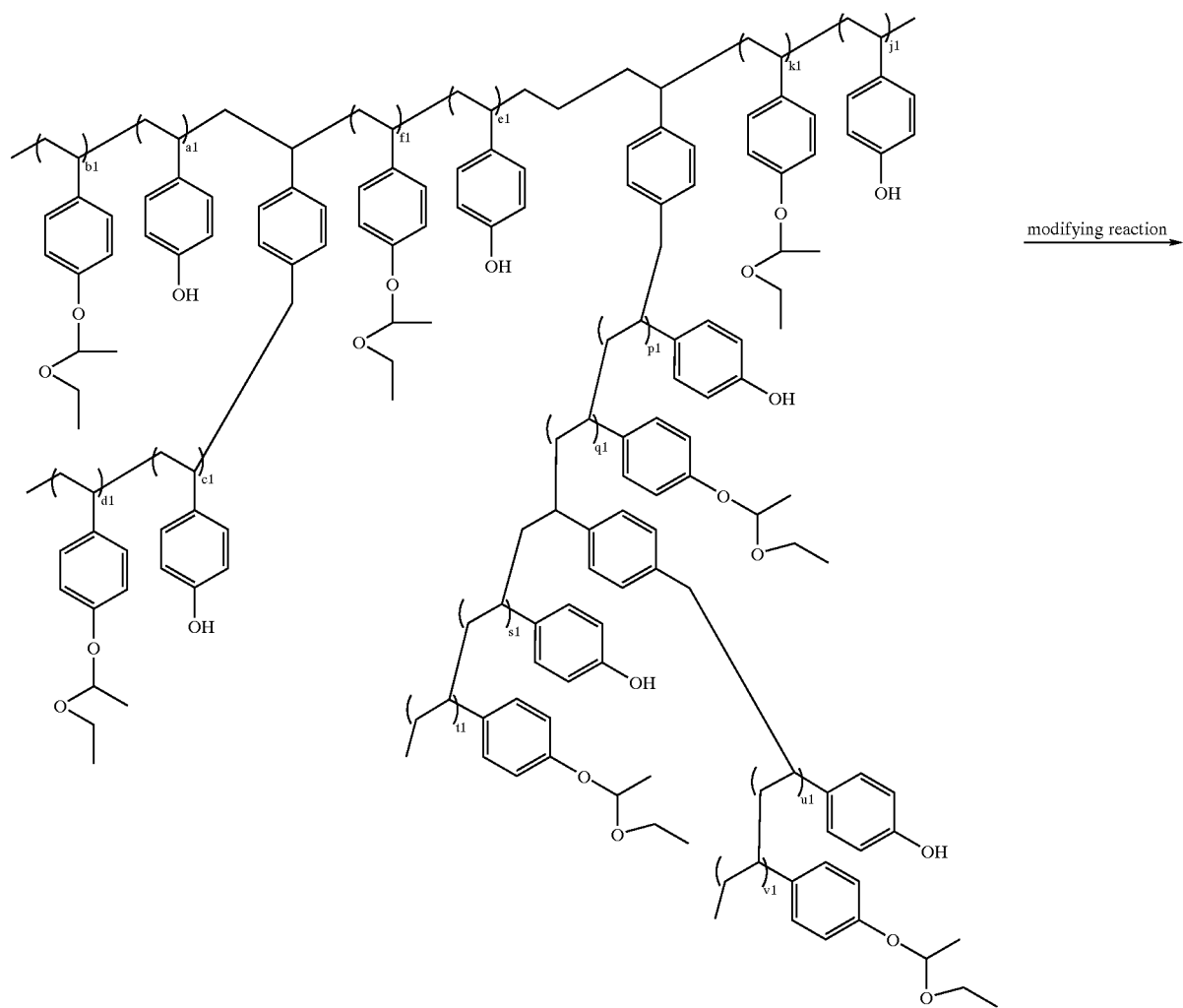
$\xrightarrow{\text{modifying reaction}}$

-continued

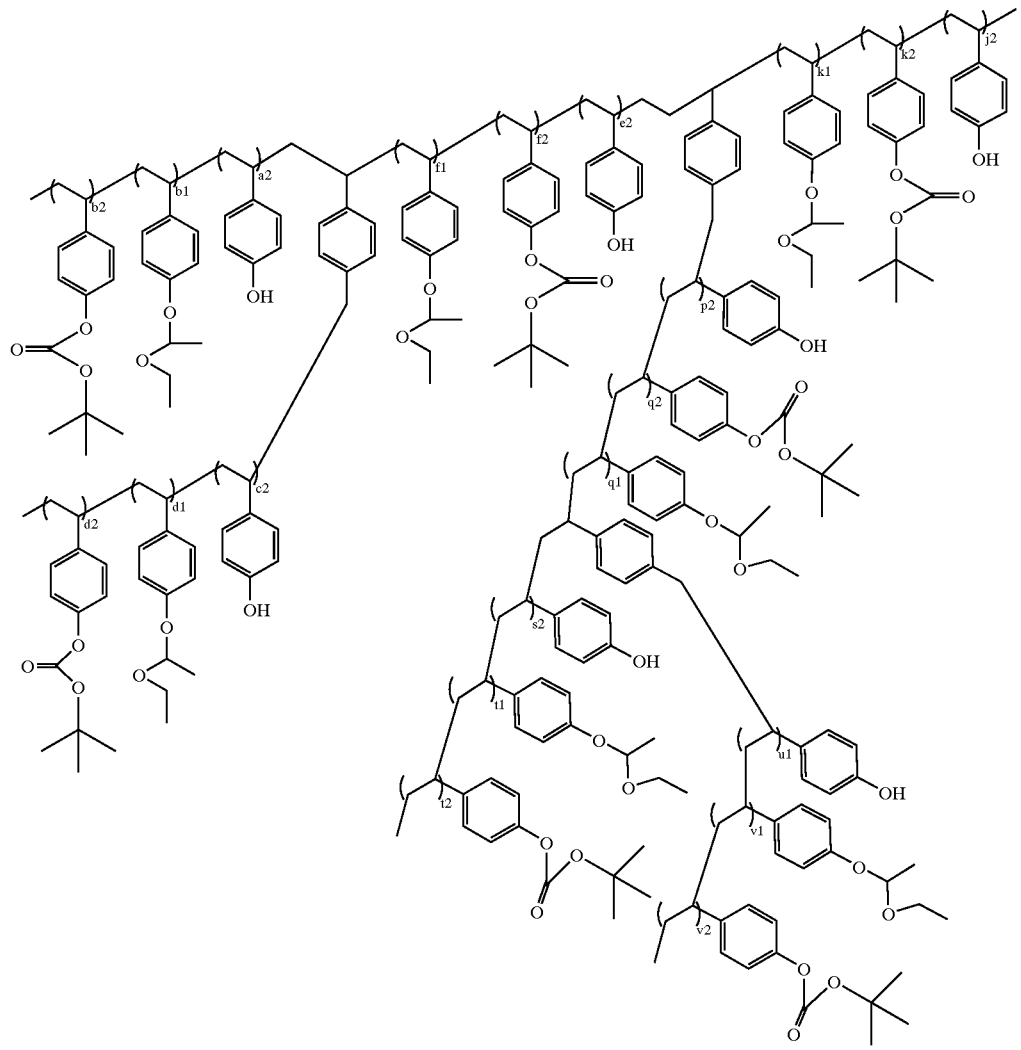

The polymers in the form of dendritic or hyperbranched polymers according to the invention essentially differ from conventional linear polymers. When polymers are used as the base resin of resist materials where the resolution is in proportion to the size of a polymer, for example, the conventional linear polymers have the drawback that reducing the size of a polymer leads to a lowering of strength. By contrast, the novel polymers of the invention permit the polymer size to be changed as desired and have the advantage that the size of a polymer can be reduced while maintaining strength. Then the novel polymers offer resist materials which have a high resolution, sensitivity and plasma etching resistance which have never been achieved with prior art resist materials.

Resist Composition

In the second aspect, the invention provides resist compositions which use the above-described polymers as the base resin, and in an especially preferred embodiment, chemical amplification type resist compositions which may be either positive or negative working.

The chemical amplification type positive resist composition is defined as comprising (A) a base resin constructed of the above-described polymer which is little or no soluble in alkali, but becomes alkali soluble by reaction with acid, (B) an organic solvent, and (C) a photoacid generator. The positive resist composition may further include (D) a basic compound and (E) a dissolution regulator.

The chemical amplification type negative resist composition is defined as comprising (A') a base resin constructed of the above-described polymer which becomes little or no soluble in alkali by crosslinking with a crosslinker, (B) an organic solvent, (C) a photoacid generator, and (F) the crosslinker. The negative resist composition may further include (D) a basic compound.

Organic Solvent (B)

The organic solvent (B) used herein may be any organic solvent in which the base resin, photoacid generator, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. These solvents may be used alone or in combinations of two or more thereof. Of the above organic solvents, it is recommended to use diethylene glycol dimethyl ether, 1-ethoxy-2-propanol and ethyl lactate because the photoacid generator serving as one of the resist components is most soluble therein, propylene glycol monomethyl ether acetate because it is a safe solvent, or a mixture thereof.

Photoacid Generator (C)

Suitable examples of the photoacid generator (C) include onium salts of the general formula (11) below, diazomethane derivatives of the general formula (12) below, glyoxime derivatives of the general formula (13) below, β-ketosulfone derivatives, disulfone derivatives, nitrobenzylsulfonate derivatives, sulfonic acid ester derivatives, imido-yl sulfonate derivatives, and halogen derivatives.

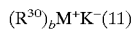

(R$^{30}$)$_b$M$^+$K$^-$  (11)

In the formula, R$^{30}$ is a straight, branched or cyclic alkyl of 1 to 12 carbon atoms, an aryl of 6 to 12 carbon atoms, or an aralkyl of 7 to 12 carbon atoms; M$^+$ is iodonium or sulfonium; K$^-$ is a non-nucleophilic counter-ion; and the letter b is 2 or 3.

Illustrative examples of alkyl groups represented by R$^{30}$ include methyl, ethyl, propyl, butyl, cyclohexyl, 2-oxocyclohexyl, norbornyl, and adamantyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary aralkyl groups include benzyl and phenethyl. Examples of the non-nucleophilic counter-ion represented by K$^-$ include halide ions such as chloride and bromide; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; and alkylsulfonate ions such as mesylate and butanesulfonate.

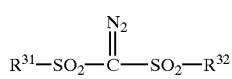

(12)

In the formula, R$^{31}$ and R$^{32}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms.

Illustrative examples of alkyl groups represented by R$^{31}$ and R$^{32}$ include methyl, ethyl, propyl, butyl, amyl, cyclopentyl, cyclohexyl, norbornyl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorobenzene, chlorobenzene, and 1,2,3,4,5-pentafluorobenzene. Exemplary aralkyl groups include benzyl and phenethyl.

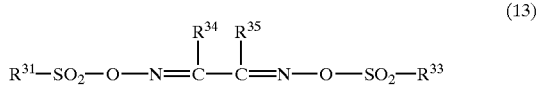

(13)

In the formula, R$^{33}$, R$^{34}$, and R$^{35}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms. R$^{34}$ and R$^{35}$ may together form a cyclic structure with the proviso that if they form a cyclic structure, each is a straight or branched alkylene group of 1 to 6 carbon atoms.

The alkyl, halogenated alkyl, aryl, halogenated aryl, and aralkyl groups represented by R$^{33}$, R$^{34}$, and R$^{35}$ are exemplified by the same groups mentioned above for R$^{31}$ and R$^{32}$. Examples of alkylene groups represented by R$^{34}$ and R$^{35}$ include methylene, ethylene, propylene, butylene, and hexylene.

Illustrative examples of the photoacid generator include:

onium salts such as diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)diphenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluene sulfonate, dimethylphenylsulfonium trifluoromethanesulfonate, dimethylphenylsulfonium p-toluenesulfonate, dicyclohexylphenylsulfonium trifluoromethanesulfonate, and dicyclohexylphenylsulfonium p-toluenesulfonate;

diazomethane derivatives such as bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane;

glyoxime derivatives such as bis-o-(p-toluene -sulfonyl)-αa-dimethylglyoxime, bis-o-(p-toluenesulfonyl)-α-diphenylglyoxime, bis-o-(p-toluenesulfonyl)-α-dicyclohexylglyoxime, bis-o-(p-toluenesulfonyl)-2,3-pentanedioneglyoxime, bis-o-(p-toluenesulfonyl)-2- methyl-3,4-pentanedioneglyoxime, bis-o-(n-butanesulfonyl)-α-dimethylglyoxime, bis-o-(n-butanesulfonyl)-α-diphenylglyoxime, bis -o-(n-butanesulfonyl)-α-dicyclohexylglyoxime, bis-o-(n-butanesulfonyl)-2,3-pentanedioneglyoxime, bis-o-(n-butanesulfonyl)-2-methyl-3,4-pentanedioneglyoxime, bis-o -(methanesulfonyl)-α-dimethylglyoxime, bis-o-(trifluoromethanesulfonyl) -α-dimethylglyoxime, bis-o-(1,1,1-trifluoroethanesulfonyl)-α-dimethylglyoxime, bis-o-(tert -butanesulfonyl)-α-dimethylglyoxime, bis-o-(perfluorooctane -sulfonyl)-α-dimethylglyoxime, bis-o-(cyclohexanesulfonyl)-α-dimethylglyoxime, bis-o-(benzenesulfonyl)-α-dimethylglyoxime, bis-o-(p-fluorobenzenesulfonyl)-α-dimethylglyoxime, bis-o-(p-tert-butylbenzenesulfonyl)-α-dimethylglyoxime, bis-o-(xylenesulfonyl)-α-dimethylglyoxime, and bis-o-(camphorsulfonyl)-α-dimethylglyoxime;

β-ketosulfone derivatives such as 2-cyclohexyl -carbonyl-2-(p-toluenesulfonyl)propane and 2-isopropyl -carbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p -toluenesulfonate;

sulfonic acid ester derivatives such as 1,2,3-tris(methanesulfonyloxy)benzene, 1,2,3-tris(trifluoromethanesulfonyloxy)benzene, and 1,2,3-tris(p -toluenesulfonyloxy)benzene; and imidoyl sulfonate derivatives such as phthalimidoyl triflate, phthalimidoyl tosylate, 5-norbornene-2,3-dicarboxyimidoyl triflate, 5-norbornene-2,3-dicarboxyimidoyl tosylate, and 5-norbornene-2,3-dicarboxyimidoyl n-butylsulfonate.

Preferred among these photoacid generators are onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, and tris(p-tert-butoxyphenyl)sulfonium p-toluenesulfonate; diazomethane derivatives such as bis(benzenesulfonyl)diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, and bis(tert-butylsulfonyl)diazomethane; and glyoxime derivatives such as bis-o-(p-toluenesulfonyl)-α-dimethylglyoxime and bis-o-(n-butanesulfonyl)-α-dimethylglyoxime, tribromophenol, dibromocamphor, tris(trichloromethyl), and s-triazine. These photoacid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The photoacid generator is added in an amount of 0.2 to 15 parts by weight, and especially 0.5 to 8 parts by weight, per 100 parts by weight of all the base resins. At less than 0.2 part, the amount of acid generated during exposure would be too low and the sensitivity and resolution are poor, whereas the addition of more than 15 parts would lower the transmittance of the resist and result in a poor resolution.

Basic Compound (D)

The basic compound (D) is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile. See JP-A 5-232706, 5-249683, 5-158239, 5-249662, 5-257282, 5-289322, and 5-289340.

Examples of basic compounds (D) include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives. Of these, aliphatic amines are especially preferred.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-isopropylamine, di-n-butylamine, di-isobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-isopropylamine, tri-n-butylamine, tri-isobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H—pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable sulfonyl group-bearing nitrogenous compounds include 3-pyridinesulfonic acid and pyridinium p-toluenesulfonate. Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-imino-diethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formulas (14) and (15) may also be included.

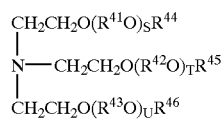

(14)

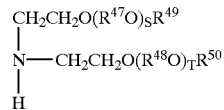

(15)

In the formulas, $R^{41}$, $R^{42}$, $R^{43}$, $R^{47}$ and $R^{48}$ are independently straight, branched or cyclic alkylenes of 1 to 20 carbon atoms; $R^{44}$, $R^{45}$, $R^{46}$, $R^{49}$ and $R^{50}$ are hydrogen, alkyls of 1 to 20 carbon atoms, or amino; $R^{44}$ and $R^{45}$, $R^{45}$ and $R^{46}$, $R^{44}$ and $R^{46}$, $R^{44}$ with $R^{45}$ and $R^{46}$, and $R^{49}$ and $R^{50}$ may bond together to form rings; and S, T and U are each integers from 0 to 20, with the proviso that hydrogen is excluded from $R^{44}$, $R^{45}$, $R^{46}$, $R^{49}$ and $R^{50}$ when S, T and U are equal to 0.

The alkylene groups represented by $R^{41}$, $R^{42}$, $R^{43}$, $R^{47}$ and $R^{48}$ preferably have 1 to 20 carbon atoms, more preferably 1 to 10 carbon atoms, and most preferably 1 to 8 carbon atoms. Examples include methylene, ethylene, n-propylene, isopropylene, n-butylene, isobutylene, n-pentylene, isopentylene, hexylene, nonylene, decylene, cyclopentylene, and cyclohexylene.

The alkyl groups represented by $R^{44}$, $R^{45}$, $R^{46}$, $R^{49}$ and $R^{50}$ preferably have 1 to 20 carbon atoms, more preferably 1 to 8 carbon atoms, and most preferably 1 to 6 carbon atoms, and may be straight, branched or cyclic. Examples include methyl, ethyl, n-propyl, isopropyl, n-butyl, isobutyl, tert-butyl, n-pentyl, isopentyl, hexyl, nonyl, decyl, dodecyl, tridecyl, cyclopentyl, and cyclohexyl.

Where a pair of $R^{44}$ and $R^{45}$, a pair of $R^{45}$ and $R^{46}$, a pair of $R^{44}$ and $R^{46}$, a combination of $R^{44}$ with $R^{45}$ and $R^{46}$, and a pair of $R^{49}$ and $R^{50}$ form rings, the rings preferably have 1 to 20 carbon atoms, more preferably 1 to 8 carbon atoms, and most preferably 1 to 6 carbon atoms, and may have branching alkyl groups of 1 to 6 carbon atoms, and especially 1 to 4 carbon atoms.

S, T, and U are each integers from 0 to 20, preferably from 1 to 10, and more preferably from 1 to 8.

Illustrative examples of the compounds of formulas (14) and (15) include tris{2-(methoxymethoxy)ethyl}amine, tris{2-(methoxyethoxy)ethyl}amine, tris[2-{(2-methoxyethoxy)methoxy}ethyl]amine, tris{2-(2-methoxyethoxy)ethyl}amine, tris{2-(1-methoxyethoxy) ethyl}amine, tris{2-(1-ethoxyethoxy)ethyl}amine, tris{2-(1-ethoxypropoxy)ethyl}amine, tris[2-((2-hydroxyethoxy) ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, and 1-aza-18-crown-6. Especially preferred basic compounds are tertiary amines, aniline derivatives, pyrrolidine derivatives, pyridine derivatives, quinoline derivatives, amino acid derivatives, hydroxyl group-bearing nitrogenous compounds, hydroxyphenyl group-bearing nitrogenous compounds, alcoholic nitrogenous compounds, amide derivatives, imide derivatives, tris{2-(methoxymethoxy) ethyl}amine, tris{2-(2-methoxyethoxy)ethyl}amine, tris[2-{2-methoxyethoxy)methyl}ethyl]amine, and 1-aza-15-crown-5.

The above-described basic compound may be used singly or in combinations of two or more thereof, and is preferably formulated in an amount of 0.01 to 2 parts, and especially 0.01 to 1 part by weight, per 100 parts by weight of all the base resins. At less than 0.01 part, the desired effects of the basic compound would not be apparent, while the use of more than 2 parts would result in too low a sensitivity.

Carboxyl Group-bearing Aromatic Compound

In the resist composition of the invention, an aromatic compound bearing a ≡C—COOH group, preferably —$R^{57}$—COOH (wherein $R^{57}$ is a straight or branched alkylene of 1 to 10 carbon atoms) may be formulated. Exemplary, non-limiting aromatic compounds bearing a ≡C—COOH group include one or more compounds selected from Groups I and II below. Including this component improves the PED stability of the resist and ameliorates edge roughness on nitride film substrates.

Group I:

Compounds in which some or all of the hydrogen atoms on the phenolic hydroxyl groups of the compounds of general formulas (16) to (25) below have been replaced with —$R^{57}$—COOH (wherein $R^{57}$ is a straight or branched alkylene of 1 to 10 carbon atoms), and in which the molar ratio C/(C+D) of phenolic hydroxyl groups (C) to ≡C—COOH groups (D) in the molecule is from 0.1 to 1.0.

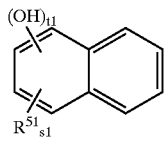

In these formulas, $R^1$ is hydrogen or methyl; $R^{51}$ and $R^{52}$ are each hydrogen or a straight or branched alkyl or alkenyl of 1 to 8 carbon atoms; $R^{53}$ is hydrogen, a straight or branched alkyl or alkenyl of 1 to 8 carbon atoms, or a —($R^{57}$)$_h$—COOR' group (R' being hydrogen or —$R^{57}$—COOH); $R^{54}$ is —(CH$_2$)$_i$— (where i is 2 to 10), an arylene of 6 to 10 carbon atoms, carbonyl, sulfonyl, an oxygen atom, or a sulfur atom; $R^{55}$ is an alkylene of 1 to 10 carbon atoms, an arylene of 6 to 10 carbon atoms, carbonyl, sulfonyl, an oxygen atom, or a sulfur atom; $R^{56}$ is hydrogen, a straight or branched alkyl or alkenyl of 1 to 8 carbon atoms, or a hydroxyl-substituted phenyl or naphthyl; $R^{57}$ is a straight or branched alkylene of 1 to 10 carbon atoms; $R^{58}$ is hydrogen, a straight or branched alkyl or alkenyl of 1 to 8 carbon atoms, or a —$R^{57}$—COOH group; the letter j is an integer from 0 to 5; u and h are each 0 or 1; s1, t1, s2, t2, s3, t3, s4, and t4 are each numbers which satisfy s1+t1=8, s2+t2=5, s3+t3=4, and s4+t4=6, and are such that each phenyl skeleton has at least one hydroxyl group; β is a number such that the compound of formula (21) may have a weight average molecular weight of 1,000 to 5,000; and γ is a number such that the compound of formula (22) may have a weight average molecular weight of 1,000 to 10,000.

Group II:

Compounds of general formulas (26) and (27) below.

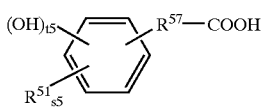 (27)

In these formulas, $R^{51}$, $R^{52}$ and $R^{57}$ are as defined above; and s5 and t5 are numbers which satisfy $s5 \geqq 0$, $t5 \geqq 0$, and $s5+t5=5$.

Illustrative, non-limiting examples of these aromatic compounds include compounds of the general formulas III-1 to III-14 and IV-1 to IV-6 below.

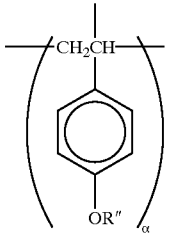 (III-1)

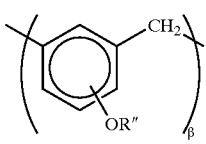 (III-2)

(III-3)

(III-4)

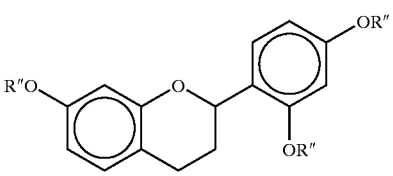 (III-5)

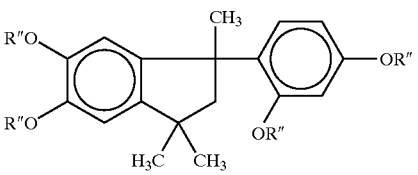 (III-6)

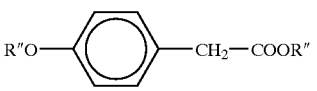 (III-7)

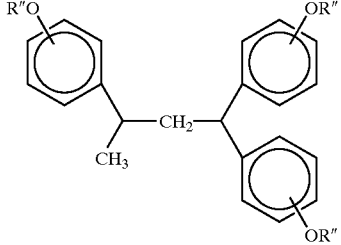 (III-8)

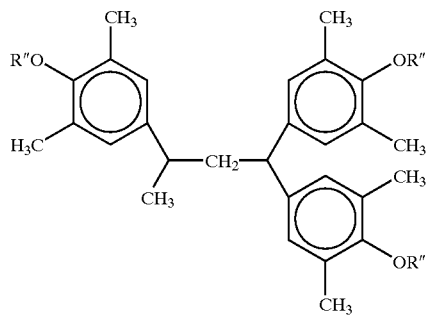 (III-9)

(III-10)

(III-11)

(III-12)

(III-13)

(III-14)

In the above formulas, R″ is hydrogen or a $CH_2COOH$ group such that the $CH_2COOH$ group accounts for 10 to 100 mol % of R″ in each compound, α and β are as defined above.

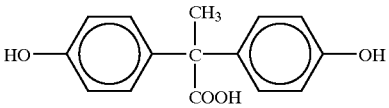 [IV-1]

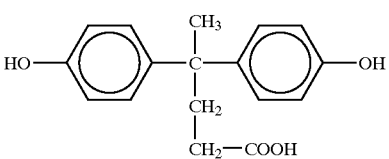 [IV-2]

[IV-3]
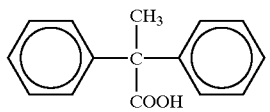

[IV-4]
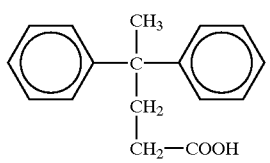

[IV-5]
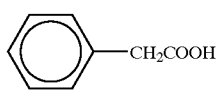

[IV-6]
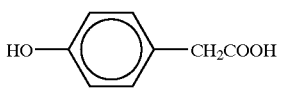

The aromatic compound bearing a ≡C—COOH group within the molecule may be used singly or as combinations of two or more thereof.

The aromatic compound bearing a ≡C—COOH group within the molecule is preferably added in an amount ranging from 0.1 to 5 parts, and more preferably 1 to 3 parts by weight, per 100 parts by weight of the base resin. At less than 0.1 part, sufficient improvement would not be achieved with regard to either footing on nitride film substrates or PED. On the other hand, at more than 5 parts, the resolution of the resist material would be unacceptably low.

Dissolution Regulator (E)

The resist composition of the invention may also include, as component (E), a dissolution regulator for enhancing the contrast. The dissolution regulator is a compound having an average molecular weight within a range of 100 to 1,000, and preferably 150 to 800, and having on the molecule at least two phenolic hydroxyl groups, in which an average of from 0 to 100 mol % of all the hydrogen atoms on the phenolic hydroxyl groups have been replaced with acid labile groups.

The degree of substitution of the hydrogen atoms on the phenolic hydroxyl groups with acid labile groups is on average at least 0 mol %, and preferably at least 30 mol %, of all the phenolic hydroxyl groups. The upper limit is 100 mol %, and preferably 80 mol %.

Preferable examples of such compounds having two or more phenolic hydroxyl groups include those of formulas (i) to (xi) below.

(i)
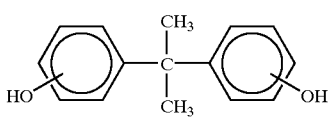

(ii)
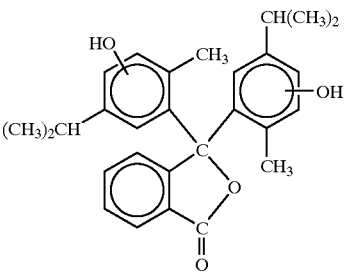

(iii)
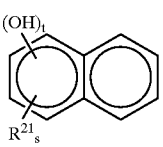

(iv)
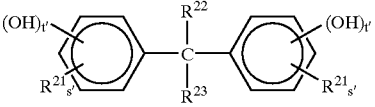

(v)
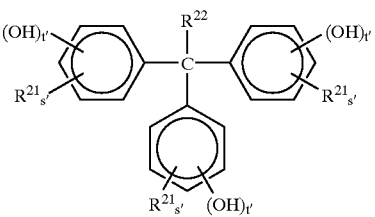

(vi)
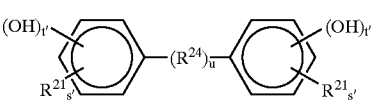

(vii)
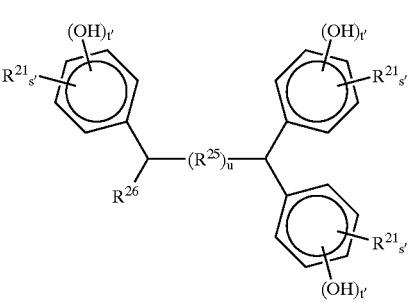

(viii)
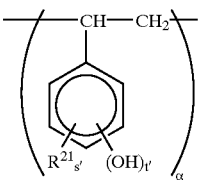

-continued

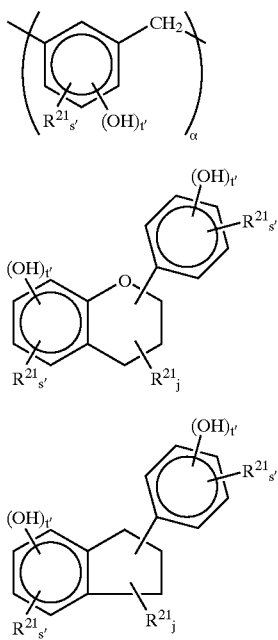

In these formulas, $R^{21}$ and $R^{22}$ are each hydrogen or a straight or branched alkyl or alkenyl of 1 to 8 carbon atoms; $R^{23}$ is hydrogen, a straight or branched alkyl or alkenyl of 1 to 8 carbon atoms, or —$(R^{27})_h$—COOH; $R^{24}$ is —$(CH_2)_i$— (where i=2 to 10), an arylene of 6 to 10 carbon atoms, carbonyl, sulfonyl, an oxygen atom, or a sulfur atom; $R^{25}$ is an alkylene of 1 to 10 carbon atoms, an arylene of 6 to 10 carbon atoms, carbonyl, sulfonyl, an oxygen atom, or a sulfur atom; $R^{26}$ is hydrogen, a straight or branched alkyl or alkenyl of 1 to 8 carbon atoms, or a hydroxyl-substituted phenyl or naphthyl; $R^{27}$ is a straight or branched alkylene of 1 to 10 carbon atoms; the letter j is an integer from 0 to 5; u and h are each 0 or 1; s, t, s', t', s", and t" are each numbers which satisfy s+t=8, s'+t'=5, and s"+t"=4, and are such that each phenyl skeleton has at least one hydroxyl group; and a is a number such that the compounds of formula (viii) or (ix) may have a molecular weight of 100 to 1,000.

In the above formulas, suitable examples of $R^{21}$ and $R^{22}$ include hydrogen, methyl, ethyl, butyl, propyl, ethynyl, and cyclohexyl; suitable examples of $R^{23}$ include the same groups as for $R^{21}$ and $R^{22}$, as well as —COOH and —$CH_2COOH$; suitable examples of $R^{24}$ include ethylene, phenylene, carbonyl, sulfonyl, oxygen, and sulfur; suitable examples of $R^{25}$ include methylene as well as the same groups as for $R^{24}$; and suitable examples of $R^{26}$ include hydrogen, methyl, ethyl, butyl, propyl, ethynyl, cyclohexyl, and hydroxyl-substituted phenyl or naphthyl.

Exemplary acid labile groups on the dissolution regulator include groups of general formula (9) or (10) above, tertiary alkyl groups of 4 to 20 carbon atoms, trialkylsilyl groups in which each of the alkyls has 1 to 6 carbon atoms, and oxoalkyl groups of 4 to 20 carbon atoms.

The compound serving here as the dissolution regulator, in which phenolic hydroxyl groups have been partially substituted with acid labile groups, may be formulated in an amount of 0 to 50 parts, preferably 5 to 50 parts, and more preferably 10 to 30 parts by weight, per 100 parts by weight of the base resin, and may be used singly or as a mixture of two or more thereof. An amount of less than 5 parts may fail to yield an improved resolution, whereas the use of more than 50 parts would lead to thinning of the patterned film, and thus a decline in resolution.

The dissolution regulators can be prepared by chemically reacting acid labile groups with a compound having phenolic hydroxyl groups in the same manner as described earlier for the base resin.

Instead of, or in addition to, the above-described dissolution regulator, the resist composition of the invention may include, as another dissolution regulator, a partially substituted compound having a weight average molecular weight of more than 1,000 and up to 3,000, and having phenolic hydroxyl groups on the molecule, in which an average of 0% to 60% of all the hydrogen atoms on the phenolic hydroxyl groups have been substituted with acid labile groups.

The compound in which the phenolic hydroxyl group hydrogens are partially substituted with these acid labile groups is preferably one or more selected from among compounds having recurring units of general formula (28) below and a weight average molecular weight of more than 1,000 and up to 3,000.

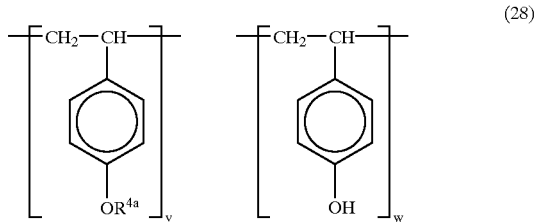

In the formula, $R^{4a}$ is an acid labile group, and v and w are respectively numbers satisfying $0 \leq v/(v+w) \leq 0.6$.

Suitable examples of the acid labile groups in the other dissolution regulator include groups of general formula (9) or (10), tertiary alkyl groups of 4 to 20 carbon atoms, trialkylsilyl groups in which each of the alkyls has 1 to 6 carbon atoms, and oxoalkyl groups of 4 to 20 carbon atoms.

Advantageously, the other dissolution regulator just described is formulated in an amount such that the total amount of dissolution regulator, including the dissolution regulator described earlier, is 0 to 50 parts, preferably 0 to 30 parts, and more preferably at least 1 part by weight, per 100 parts by weight of the base resins.

The other dissolution regulator can be prepared by chemically reacting acid labile groups with a compound having phenolic hydroxyl groups in the same manner as described earlier for the base resin.

UV Absorber

The resist composition of the invention may further include an UV absorber which is typically a compound having a molar absorbance of not more than 10,000 at a wavelength of 248 nm. The inclusion of the UV absorber allows the resist composition to be designed and controlled to have a suitable transmittance for substrates of differing reflectances.

Illustrative examples of the UV absorber include fused polycyclic hydrocarbon derivatives such as pentalene, indene, naphthalene, azulene, heptalene, biphenylene, indacene, fluorene, phenalene, phenanthrene, anthracene, fluoranthene, acephenanthrylene, aceanthrylene, triphenylene, pyrene, chrysene, pleiadene, picene, perylene, pentaphene, pentacene, benzophenanthrene, anthraquinone, anthrone, benzanthrone, 2,7-dimethoxynaphthalene, 2-ethyl-9,10-dimethoxyanthracene, 9,10-dimethylanthracene, 9-ethoxyanthracene, 1,2-naphthoquinone, 9-fluorene, and the compounds of general formulas (29) and (30) below; fused heterocyclic derivatives such as thioxanthene-9-one, thianthrene, and dibenzothiophene; benzophenone derivatives such as 2,3,4-trihydroxybenzophenone, 2,3,4,4'-tetrahydroxybenzophenone, 2,4-dihydroxybenzophenone, 3,5-dihydroxybenzophenone, 4,4'-dihydroxybenzophenone, and 4,4'-bis(dimethylamino)benzophenone; and squaric acid derivatives such as squaric acid and dimethyl squarate.

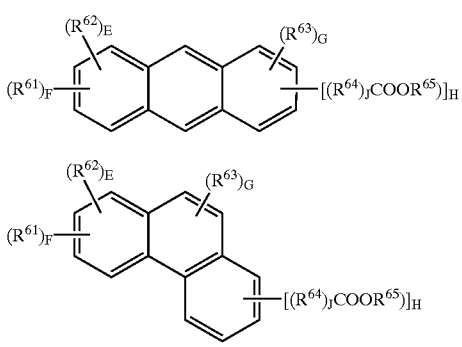

In the formulas, $R^{61}$ to $R^{63}$ are independently hydrogen, straight or branched alkyl, straight or branched alkoxy, straight or branched alkoxyalkyl, straight or branched alkenyl, or aryl. $R^{64}$ is a substituted or unsubstituted divalent aliphatic hydrocarbon group which may contain an oxygen atom, a substituted or unsubstituted divalent alicyclic hydrocarbon group which may contain an oxygen atom, a substituted or unsubstituted divalent aromatic hydrocarbon group which may contain an oxygen atom, or an oxygen atom. Also, $R^{65}$ is an acid labile group; the letter J is 0 or 1; E, F, and G are each 0 or integers from 1 to 9; H is a positive integer from 1 to 10; and E+F+G+H≦10.

More particularly, in above formulas (29) and (30), $R^{61}$ to $R^{63}$ are independently hydrogen, straight or branched alkyl, straight or branched alkoxy, straight or branched alkoxyalkyl, straight or branched alkenyl, or aryl. Preferable examples of the straight or branched alkyl groups include those having 1 to 10 carbon atoms, such as methyl, ethyl, n-propyl, isopropyl, n-butyl, sec-butyl, tert-butyl, hexyl, cyclohexyl, and adamantyl; of these, the use of methyl, ethyl, isopropyl, or tert-butyl is especially preferred. Preferable examples of straight or branched alkoxy groups include those having 1 to 8 carbon atoms, such as methoxy, ethoxy, propoxy, isopropoxy, n-butoxy, sec-butoxy, tert-butoxy, hexyloxy, and cyclohexyloxy; of these, the use of methoxy, ethoxy, isopropoxy, and tert-butoxy is especially preferred. Preferable examples of the straight or branched alkoxyalkyl groups include those having 2 to 10 carbon atoms, such as methoxymethyl, 1-ethoxyethyl, 1-ethoxypropyl, 1-propoxyethyl, and tert-butoxyethyl; of these, the use of methoxymethyl, 1-ethoxyethyl, 1-ethoxypropyl, and 1-propoxyethyl is especially preferred. Preferable examples of the straight or branched alkenyl groups include those having 2 to 4 carbon atoms, such as vinyl, propenyl, allyl, and butenyl. Preferable examples of the aryl groups include those having 6 to 14 carbon atoms, such as phenyl, xylyl, toluyl, and cumenyl.

$R^{64}$ is a substituted or unsubstituted divalent aliphatic hydrocarbon group which may contain an oxygen atom, a substituted or unsubstituted divalent alicyclic hydrocarbon group which may contain an oxygen atom, a substituted or unsubstituted divalent aromatic hydrocarbon group which may contain an oxygen atom, or an oxygen atom; and J in the formula is 0 or 1. When J is 0, the —$R^{64}$-linkage is a single bond.

Preferable examples of substituted or unsubstituted divalent aliphatic hydrocarbon groups which may contain an oxygen atom include those having 1 to 10 carbon atoms, such as methylene, ethylene, n-propylene, isopropylene, n-butylene, sec-butylene, —$CH_2O$—, —$CH_2CH_2O$—, and —$CH_2OCH_2$—. Of these, methylene, ethylene, —$CH_2O$—, and —$CH_2CH_2O$— are preferable.

Preferable examples of substituted or unsubstituted divalent alicyclic hydrocarbon groups which may contain an oxygen atom include those having 5 to 10 carbon atoms, such as 1,4-cyclohexylene, 2-oxacyclohexan-1,4-ylene, and 2-thiacyclohexan-1,4-ylene.

Preferable examples of substituted or unsubstituted divalent aromatic hydrocarbon groups which may contain an oxygen atom include those having 6 to 14 carbon atoms, such as o-phenylene, p-phenylene, 1,2-xylen-3,6-ylene, toluen-2,5-ylene, and 1-cumen-2,5-ylene; and allylalkylene groups having 6 to 14 carbon atoms, such as —$CH_2Ph$—, —$CH_2PhCH_2$—, —$OCH_2Ph$—, and —$OCH_2PhCH_2O$— (wherein Ph stands for phenylene).

$R^{65}$ is an acid labile group, the term "acid labile group" referring here to a moiety in which a carboxyl group has been substituted with one or more functional groups cleavable in the presence of an acid. This may be any moiety which cleaves in the presence of an acid to liberate an alkali-soluble functional group, although moieties having general formula (31a), (31b), or (31c) below are preferred.

In the formulas, $R^{66}$ to $R^{69}$ are independently hydrogen or a straight or branched alkyl, straight or branched alkoxy, straight or branched alkoxyalkyl, straight or branched alkenyl, or aryl, any of which groups may have a carbonyl on the chain thereof, provided that $R^{66}$ to $R^{69}$ are not all hydrogen. $R^{66}$ and $R^{67}$ may bond together to form a ring. $R^{69}$ is a straight or branched alkyl, straight or branched alkoxyalkyl, straight or branched alkenyl, or aryl, any of which may have a carbonyl on the chain thereof. $R^{69}$ may bond with $R^{66}$ to form a ring.

These straight or branched alkyl, straight or branched alkoxy, straight or branched alkoxyalkyl, straight or branched alkenyl, and aryl groups are exemplified by the same groups mentioned above for $R^{61}$ to $R^{63}$.

Examples of rings formed by the combination of $R^{66}$ and $R^{67}$ in formula (31a) include those having 4 to 10 carbon atoms, such as cyclohexylidene, cyclopentylidene, 3-oxocyclohexylidene, 3-oxo-4-oxacyclohexylidene, and 4-methylcyclohexylidene.

Examples of rings formed by the combination of $R^{66}$ and $R^{67}$ in formula (31b) include those having 3 to 9 carbon atoms, such as 1-silacyclohexylidene, 1-silacyclopentylidene, 3-oxo-1-silacyclohexylidene, and 4-methyl-1-silacyclopentylidene.

Examples of rings formed by the combination of $R^{69}$ and $R^{66}$ in formula (31c) include those having 4 to 10 carbon atoms, such as 2-oxacyclohexylidene, 2-oxacyclopentylidene, and 2-oxa-4-methylcyclohexylidene.

Exemplary groups represented by the formula (31a) include tertiary alkyl groups having 4 to 10 carbon atoms, such as tert-amyl, 1,1-dimethylethyl, 1,1-dimethylbutyl, 1-ethyl-1-methylpropyl, and 1,1-diethylpropyl; and 3-oxoalkyl groups, such as 1,1-dimethyl-3-oxobutyl, 3-oxocyclohexyl, and 1-methyl-3-oxo-4-oxacyclohexyl.

Exemplary groups represented by the formula (31b) include trialkylsilyl groups having 3 to 10 carbon atoms, such as trimethylsilyl, ethyldimethylsilyl, dimethylpropylsilyl, diethylmethylsilyl, triethylsilyl, and tert-butyldimethylsilyl.

Exemplary groups represented by the formula (31c) include groups having 2 to 8 carbon atoms, such as 1-methoxymethyl, 1-methoxyethyl, 1-ethoxyethyl, 1-ethoxypropyl, 1-ethoxyisobutyl, 1-n-propoxyethyl, 1-tert-butoxyethyl, 1-n-butoxyethyl, 1-isobutoxyethyl, 1-tert-pentoxyethyl, 1-cyclohexyloxyethyl, 1-(2'-n-butoxyethoxy)ethyl, 1-(2-ethylhexyloxy)ethyl, 1-{4-(acetoxymethyl)cyclohexylmethyloxy}ethyl, 1-{4-(tert-butoxycarbonyloxymethyl)cyclohexylmethyloxy}ethyl, 1-methoxy-1-methylethyl, 1-ethoxypropyl, dimethoxymethyl, diethoxymethyl, 2-tetrahydrofuranyl, and 2-tetrahydropyranyl.

In above formulas (29) and (30), E, F and G are each 0 or positive integers from 1 to 9, and H is a positive integer from 1 to 10, so as to satisfy $E+F+G+H \leq 10$.

Preferable examples of compounds represented by formulas (29) and (30) include the compounds shown in formulas (32a) to (32j) below.

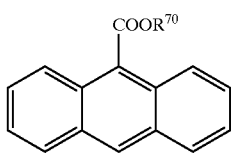
(32a)

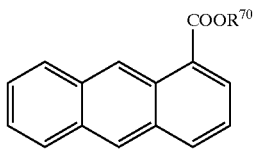
(32b)

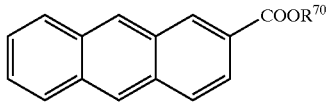
(32c)

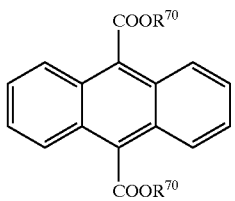
(32d)

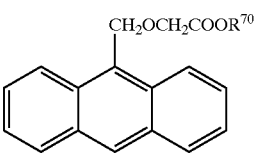
(32e)

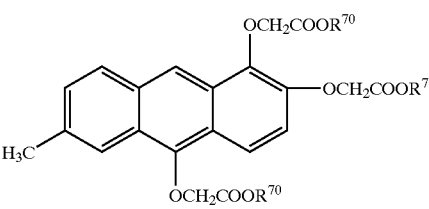
(32f)

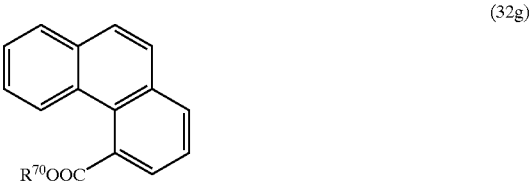
(32g)

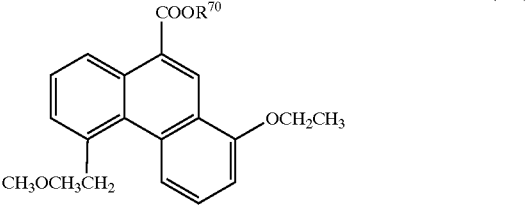
(32h)

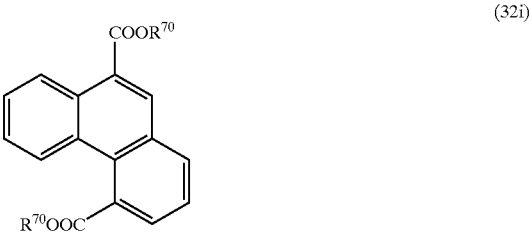
(32i)

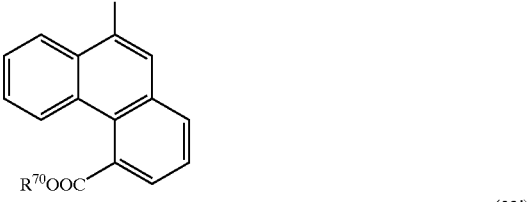
(32j)

In these formulas, $R^{70}$ is an acid labile group.

Further examples of the UV absorber include diarylsulfoxide derivatives such as bis(4-hydroxyphenyl)sulfoxide, bis(4-tert-butoxyphenyl)sulfoxide, bis(4-tert-butoxycarbonyloxyphenyl)sulfoxide, and bis[4-(1-ethoxyethoxy)phenyl]sulfoxide; diarylsulfone derivatives such as bis(4-hydroxyphenyl)sulfone, bis(4-tert-butoxyphenyl)sulfone, bis(4-tert-butoxycarbonyloxyphenyl)sulfone, bis[4-(1-ethoxyethoxy)phenyl]sulfone, and bis[4-(1-ethoxypropoxy)phenyl]sulfone; diazo compounds such as benzoquinonediazide, naphthoquinonediazide, anthraquinonediazide, diazofluorene, diazotetralone, and diazophenanthrone; and quinonediazide group-containing compounds such as the complete or partial ester compounds of naphthoquinone-1,2-diazide-5-sulfonate chloride with 2,3,4-trihydroxybenzophenone, and the complete or partial ester compounds of 2-diazide-4-sulfonate chloride with 2,4,4'-trihydroxybenzophenone.

Preferable examples of the UV absorber include tert-butyl 9-anthracenecarboxylate, tert-amyl 9-anthracenecarboxylate, tert-methoxymethyl 9-anthracenecarboxylate, tert-ethoxyethyl 9-anthracenecarboxylate, tert-tetrahydropyranyl 9-anthracenecarboxylate, tert-tetrahydrofuranyl 9-anthracenecarboxylate, and partial ester compounds of naphthoquinone-1,2-diazide-5-sulfonate chloride with 2,3,4-trihydroxybenzophenone.

The UV absorber is included in an amount of preferably 0 to 10 parts, more preferably 0.5 to 10 parts, and even more preferably 1 to 5 parts by weight, per 100 parts by weight of the base resin.

Acetylene Alcohol Derivative

The resist composition of the invention may additionally include an acetylene alcohol derivative for the purpose of enhancing the shelf stability.

Examples of compounds preferred for use as the acetylene alcohol derivative include those having general formulas (33) and (34) below.

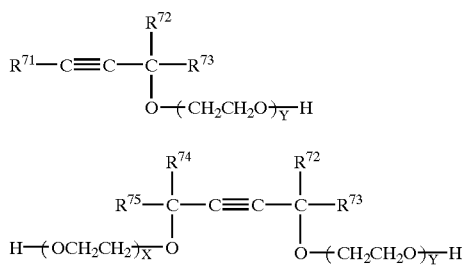

In the formulas, $R^{71}$, $R^{72}$, $R^3$, $R^{74}$, and $R^{75}$ are each hydrogen or a straight, branched, or cyclic alkyl of 1 to 8 carbon atoms; and X and Y are each 0 or a positive integer, satisfying $0 \leq X \leq 30$, $0 \leq Y \leq 30$, and $0 \leq X+Y \leq 40$.

Preferable examples of the acetylene alcohol derivative include Surfynol 61, Surfynol 82, Surfynol 104, Surfynol 104E, Surfynol 104H, Surfynol 104A, Surfynol TG, Surfynol PC, Surfynol 440, Surfynol 465, and Surfynol 485 from Air Products and Chemicals Inc., and Olfin E1004 from Nisshin Chemical Industry K.K.

The acetylene alcohol derivative is added in an amount of preferably 0.01 to 2% by weight, and more preferably 0.02 to 1% by weight, per 100% by weight of the resist composition. Less than 0.01% by weight would be ineffective for improving coating characteristics and shelf stability, whereas more than 2% by weight would result in a resist having a low resolution.

Crosslinker (F)

The crosslinker (F) is a compound capable of promoting crosslinking under the action of an acid and includes melamine compounds, epoxy compounds, and urea compounds, examples of which are shown below.

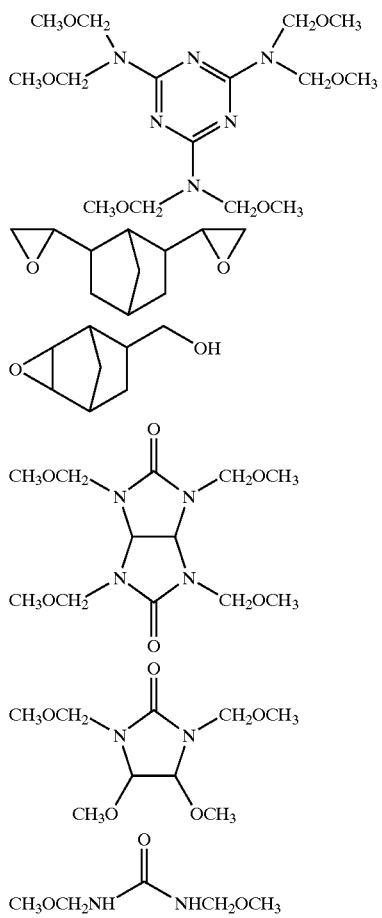

An appropriate amount of the crosslinker blended is 5 to 95 parts, more preferably 15 to 85 parts, and most preferably 20 to 75 parts by weight per 100 parts by weight of the base resin. Less than 5 parts of the crosslinker may be short to induce sufficient crosslinking reaction, resulting in a reduced film retention and winding and swelling of the pattern. More than 95 parts of the crosslinker may leave more scum, exacerbating development.

Surfactant

The resist composition of the invention may include, as an optional ingredient, a surfactant which is commonly used for improving the coating characteristics. Such optional ingredients may be added in conventional amounts so long as this does not compromise the objects of the invention.

A nonionic surfactant is preferred, examples of which include perfluoroalkyl polyoxyethylene ethanols, fluorinated alkyl esters, perfluoroalkylamine oxides, and fluorinated organosiloxane compounds. Illustrative examples include Florade FC-430 and FC-431 from Sumitomo 3M Ltd., Surflon S -141, S-145, S-381 and S-383 from Asahi Glass Co., Ltd., Unidyne DS-401, DS-403, and DS-451 from Daikin Industries Ltd., Megaface F-8151, F-171, F-172, F-173 and F-177 from Dainippon Ink & Chemicals, Inc., and X-70-092 and X-70-093 from Shin-Etsu Chemical Co., Ltd. Preferred surfactants include Florade FC-430 from Sumitomo 3M Ltd. and X-70-093 from Shin-Etsu Chemical Co., Ltd.

Process

Pattern formation using the resist composition of the invention may be carried out by a known lithographic technique. For example, the resist composition may be applied onto a substrate such as a silicon wafer by spin coating or the like to form a resist film having a thickness of 0.2 to 2.0 µm, which is then pre-baked on a hot plate at 60 to 150° C. for 1 to 10 minutes, and preferably at 80 to 120° C. for 1 to 5 minutes. A patterning mask having the desired pattern may then be placed over the resist film, and the film exposed through the mask to an electron beam or to high-energy radiation such as deep-UV rays having a wavelength below 300 nm, an excimer laser, or x-rays in a dose of about 1 to 200 mJ/cm$^2$, and preferably about 10 to 100 mJ/cm$^2$, then post-exposure baked (PEB) on a hot plate at 60 to 150° C. for 1 to 5 minutes, and preferably at 80 to 120° C. for 1 to 3 minutes. Finally, development may be carried out using as the developer an aqueous alkali solution, such as 0.1 to 5%, and preferably 2 to 3%, tetramethylammonium hydroxide (TMAH), this being done by a conventional method such as dipping, puddling, or spraying for a period of 0.1 to 3 minutes, and preferably 0.5 to 2 minutes. These steps result in the formation of the desired pattern on the substrate. Of the various types of high-energy radiation that may be used, the resist composition of the invention is best suited to fine pattern formation with, in particular, deep-UV rays having a wavelength of 146 to 254 nm, an excimer laser, x-rays, or an electron beam. The desired pattern may not be obtainable outside the upper and lower limits of the above range.

The resist composition comprising the polymer of the invention has an excellent resolution, reduced line edge roughness, and dry etching resistance and is useful as a chemical amplification type resist composition. Such a high resolution is accomplished whether the composition is positive or negative working.

EXAMPLE

Examples of the invention are given below by way of illustration and not by way of limitation.

Synthetic Example 1

Synthesis of tri-branched poly(p-hydroxystyrene)

A 1-liter flask was charged with 500 ml of tetrahydrofuran as a solvent and 0.01 mol of sec-butyl lithium as an initiator. To the solution at −78° C. was added 30 g of p-tert-butoxystyrene. With stirring, polymerization reaction was effected for 30 minutes. The reaction solution turned red. For producing a branched polymer, 0.005 mol of p-chloromethylstyrene was added to the reaction solution whereupon reaction was effected for 5 minutes. The reaction solution was red. Further 15 g of p-tert-butoxystyrene was added. With stirring, polymerization reaction was effected for 30 minutes. Polymerization was stopped by adding 0.1 mol of methanol to the reaction solution.

For purifying the polymer, the reaction mixture was poured into methanol whereupon the polymer precipitated. Separation and drying yielded 29 g of a white polymer which was tri-branched poly(p-tert-butoxystyrene).

For producing tri-branched poly(p-hydroxystyrene), 29 g of the above tri-branched poly(p-tert-butoxystyrene) was dissolved in 300 ml of acetone. A minor amount of conc. hydrochloric acid was added to the solution at 60° C., which was stirred for 7 hours. The reaction solution was poured into water whereupon the polymer precipitated. Washing and drying yielded 18 g of a polymer. Since a peak attributable to tert-butyl group was not found in GPC and proton-NMR analysis, this polymer was confirmed to be tri-branched poly(p-hydroxystyrene) having a narrow molecular weight distribution.

Synthetic Example 2

Synthesis of tri-branched poly(partially ethoxyethoxylated p-hydroxystyrene)

The tri-branched polyhydroxystyrene obtained in Synthetic Example 1, 10 g, was dissolved in 100 ml of tetrahydrofuran and a catalytic amount of methanesulfonic acid was added. With stirring at 20° C., 3 g of ethyl vinyl ether was added to the solution. Reaction was effected for one hour whereupon the reaction solution was neutralized with conc. aqueous ammonia. The neutralized reaction solution was added dropwise to 5 liters of water whereupon a white solid settled out. The solid was collected by filtration and dissolved in 100 ml of acetone, and added dropwise to 5 liters of water again. The precipitate was collected by filtration and dried in vacuum, obtaining a polymer designated Polymer 1. On proton-NMR analysis of Polymer 1, the substitution rate of ethoxyethyl groups on the tri-branched polyhydroxystyrene was determined.

Synthetic Example 3

Synthesis of tri-branched poly(p-tert-butoxycarbonyloxystyrene-p-hydroxystyrene)

The tri-branched polyhydroxystyrene obtained in Synthetic Example 1, 20 g, was dissolved in 200 ml of pyridine. With stirring at 45° C., 10 g of di-tert-butyl dicarbonate was added to the solution. Reaction was effected for one hour whereupon the reaction solution was added dropwise to 3 liters of water whereupon a white solid settled out. The solid was collected by filtration and dissolved in 100 ml of acetone, and added dropwise to 5 liters of water again. The precipitate was collected by filtration and dried in vacuum, obtaining a polymer designated Polymer 4. On proton—NMR analysis of Polymer 4, the substitution rate of t-BOC groups for the hydrogen atoms of hydroxyl group in the tri-branched polyhydroxystyrene was determined.

Synthetic Example 4

Synthesis of nona-branched poly(p-hydroxystyrene)

A 2-liter flask was charged with 1000 ml of tetrahydrofuran as a solvent and 0.06 mol of sec-butyl lithium as an initiator. To the solution at −78° C. was added 60 g of p-tert-butoxystyrene. With stirring, polymerization reaction was effected for 30 minutes. The reaction solution turned red. For producing a tri-branched polymer, 0.03 mol of p-chloromethylstyrene was added to the reaction solution whereupon reaction was effected for 5 minutes. Then 30 g of p-tert-butoxystyrene was added to the reaction solution, which was stirred for 30 minutes for polymerization. The reaction solution was red. For producing penta-branched polymer, 0.03 mol of p-chloromethylstyrene was added to the reaction solution whereupon reaction was effected for 5 minutes. Then 15 g of p-tert-butoxystyrene was added to the reaction solution, which was stirred for 30 minutes for polymerization. The reaction solution was red. Finally for producing nona-branched polymer, 0.015 mol of p-chloromethylstyrene was added to the reaction solution whereupon reaction was effected for 5 minutes. 7.5 g of p-tert-butoxystyrene was added to the reaction solution, which was stirred for 30 minutes for polymerization. The reaction solution was red.

Further 10 g of p-tert-butoxystyrene was added to the reaction solution. With stirring, polymerization reaction was effected for 30 minutes. Polymerization was stopped by adding 0.1 mol of carbon dioxide gas to the reaction solution.

For purifying the polymer, the reaction mixture was poured into methanol whereupon the polymer precipitated. Separation and drying yielded 99 g of a white polymer which was nona-branched poly(p-tert-butoxystyrene).

For converting to nona-branched poly(p-hydroxystyrene), 99 g of the above nona-branched poly(p-tert-butoxystyrene) was dissolved in 1000 ml of acetone. A minor amount of conc. hydrochloric acid was added to the solution at 60° C., which was stirred for 7 hours. The reaction solution was poured into water whereupon the polymer precipitated. Washing and drying yielded 66 g of a polymer. Since a peak attributable to tert-butyl group was not found on GPC and proton-NMR analysis, this polymer was confirmed to be nona-branched poly(p-hydroxystyrene) having a narrow molecular weight distribution.

Synthetic Example 5

Synthesis of nona-branched poly(partially ethoxyethoxylated p-hydroxystyrene)

In a 2-liter flask, 99 g of the nona-branched poly(p-hydroxystyrene) obtained in Synthetic Example 4 was dissolved in 1000 ml of tetrahydrofuran and a catalytic amount of methanesulfonic acid was added. With stirring at 20° C., 25 g of ethyl vinyl ether was added to the solution. Reaction was effected for 2 hours whereupon the reaction solution was neutralized with conc. aqueous ammonia. The neutralized solution was added dropwise to 10 liters of water whereupon a white solid settled out. The solid was collected by filtration and dissolved in 500 ml of acetone, and added dropwise to 10 liters of water again. The precipitate was collected by filtration and dried in vacuum, obtaining a polymer designated Polymer 3. On proton-NMR analysis of Polymer 3, the substitution rate of ethoxyethyl groups was determined.

Polymers 2, 4, 6 to 11 to be described later were prepared as above. It is noted that Polymer 5 was prepared further crosslinking with 1,4-butane diol divinyl ether.

Examples 1–18 and Comparative Examples 1–13

Polymer 1 to 17 (polyhydroxystyrene in which some of the hydroxyl groups are protected with acid labile groups) as the base resin, photoacid generators PAG 1 to 3, dissolution regulators DRR 1 and 2, and a crosslinker, all the formulas being shown below, were dissolved in an amount six times the weight of solids of propylene glycol monomethyl ether acetate (PGMEA) to form liquid resist compositions. These compositions were each passed through a 0.2 μm Teflon filter to give the finished resist solution.

This resist solution was spin-coated onto a silicon wafer which had been coated with DUV-30 (Nissan Chemical K.K.) to a thickness of 55 nm so that the reflectance to KrF light (248 nm) was less than 1%. The coated silicon wafer was baked on a hot plate at 100° C. for 90 seconds. The thickness of the resist film was set at 0.55 μm.

The resist film was exposed using an excimer laser stepper (S-202A, from Nikon Corporation; NA=0.6), immediately baked at 110+ C. for 90 seconds and developed for 60 seconds with a 2.38 wt % solution of tetramethylammonium hydroxide in water, thereby giving a positive pattern.

The resist patterns obtained were evaluated as described below. The results are shown in Tables 1 and 2.

Using a measuring SEM model S-7280 (Hitachi Ltd.), the optimal exposure dose (sensitivity, Eop) was defined as the dose which provides a 1:1 resolution at the top and bottom of a 0.25 μm line-and-space pattern. The resolution of the resist under evaluation was defined as the minimum line width of the lines and spaces that separated at this dose.

The side of the 0.25 μm line was observed for irregularities under the measuring SEM.

Dry etching resistance was examined by an etching test on the resist spin-coated wafer. Using a dry etching apparatus model TE-8500P (by Tokyo Electron K.K.), the resist film was etched with $CHF_3/CF_4$ gas. The difference in thickness of the resist film before and after dry etching and surface irregularities on the resist film after dry etching were measured by means of an atomic force microscope model D-500 (by Digital Instrument Co.). The etching conditions are shown below.

| | |
|---|---|
| Chamber pressure | 300 mTorr |
| RF power | 1300 W |
| Gap | 9 mm |
| $CHF_3$ gas flow rate | 30 sccm |
| $CF_4$ gas flow rate | 30 sccm |
| Ar gas flow rate | 100 sccm |
| Time | 60 sec |

Polymer 1: three branches

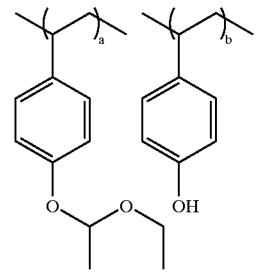

a: b = 0.3:0.7, Mw = 11,000, Mw/Mn = 1.20

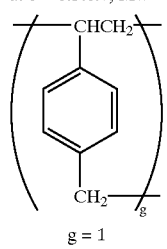

g = 1

Polymer 2: five branches

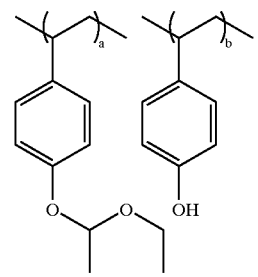

a: b = 0.26:0.74, Mw = 11,000, Mw/Mn = 1.30

-continued
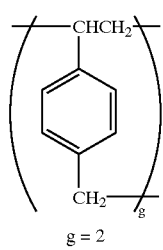
g = 2
Polymer 3: nine branches
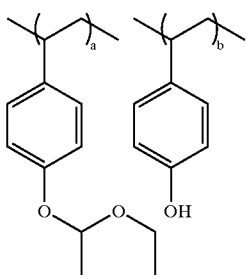
a: b = 0.24:0.76, Mw = 12,000, Mw/Mn = 1.40
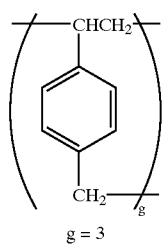
g = 3
Polymer 4: three branches
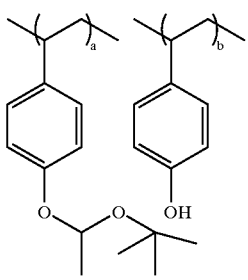
a: b = 0.26:0.74, Mw = 11,000, Mw/Mn = 1.20
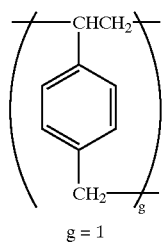
g = 1
-continued
Polymer 5: polymer with three branches is further crosslinked
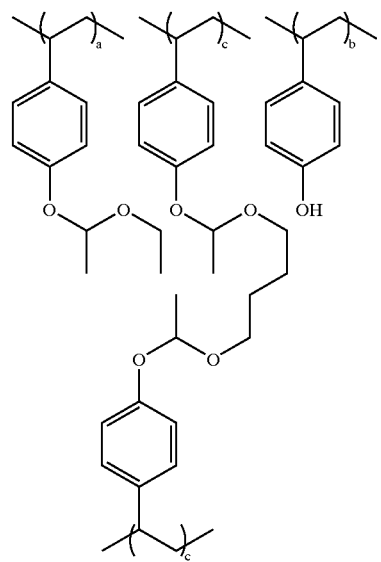
a: b: c = 0.22:0.72:0.06, Mw = 24,000, Mw/Mn = 2.30
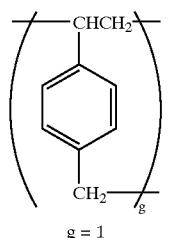
g = 1
Polymer 6: three branches
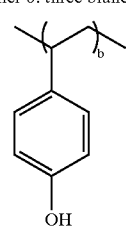
Mw = 11,000, Mw/Mn = 1.20
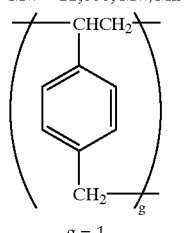
g = 1
Polymer 7: five branches
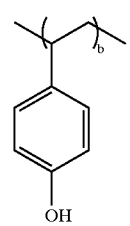
Mw = 11,000, Mw/Mn = 1.30

-continued
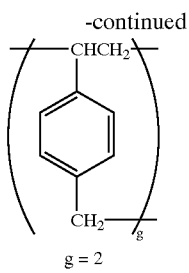
g = 2
Polymer 8: nine branches
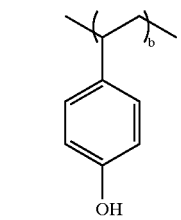
Mw = 12,000, Mw/Mn = 1.40
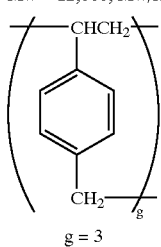
g = 3
Polymer 9: thirty three branches
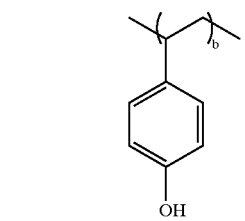
a: b = 0.20:0.80, Mw = 12,000, Mw/Mn = 1.80
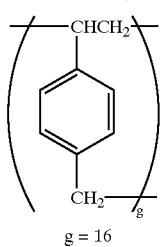
g = 16
Polymer 10: three branches
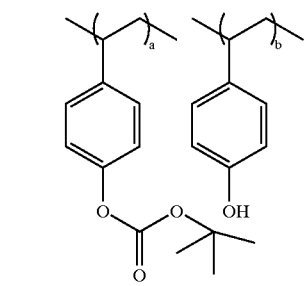
a: b = 0.10:0.90, Mw = 11,000, Mw/Mn = 1.20
-continued
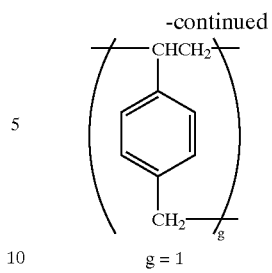
g = 1
Polymer 11: three branches
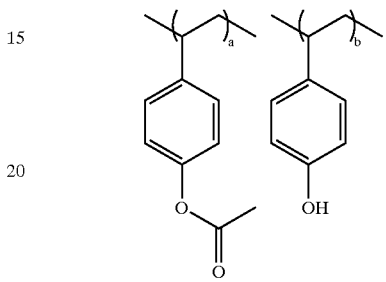
a: b = 0.10:0.90, Mw = 11,000, Mw/Mn = 1.20
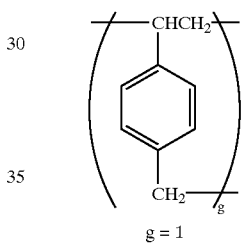
g = 1
Polymer 12: linear polymer
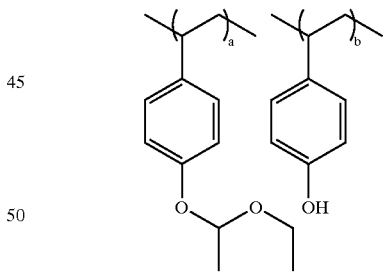
a: b = 0.35:0.65, Mw = 11,000, Mw/Mn = 1.20
Polymer 13: linear polymer
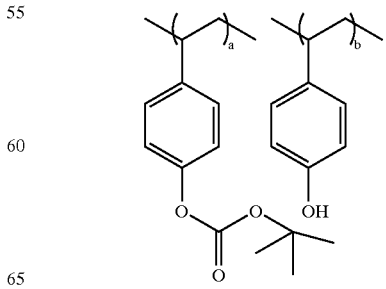
a: b = 0.26:0.74, Mw = 11,000, Mw/Mn = 1.20

-continued
Polymer 14: linear polymer
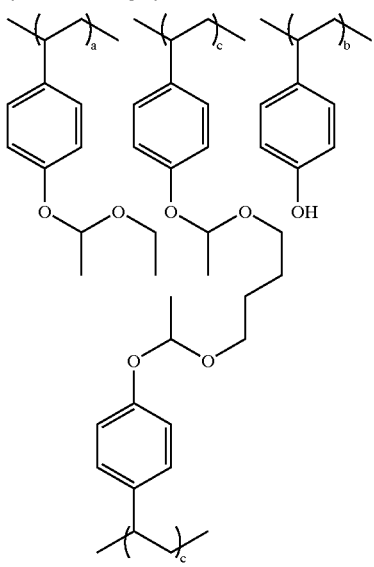
a: b: c = 0.25:0.69:0.06, Mw = 24,000, Mw/Mn = 2.10
Polymer 15: linear polymer
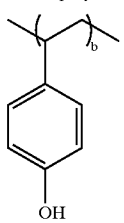
b = 1.00, Mw = 11,000, Mw/Mn = 1.10
Polymer 16: linear polymer
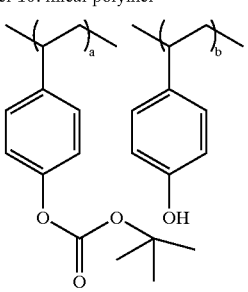
a: b = 0.10:0.90, Mw = 11,000, Mw/Mn = 1.10
Polymer 17: linear polymer
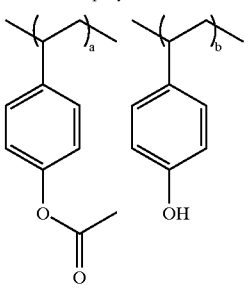
a: b = 0.10:0.90, Mw = 11,000, Mw/Mn = 1.10
-continued
(PAG1)
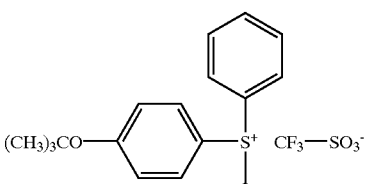
(PAG2)
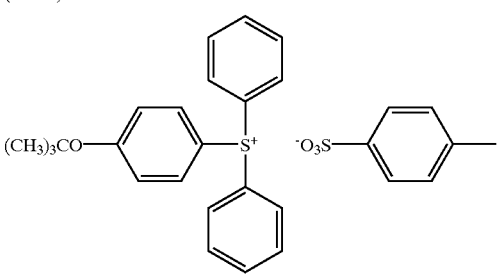
(PAG3)
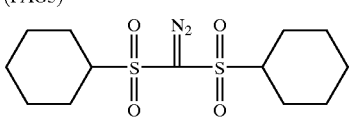
(DRR1)
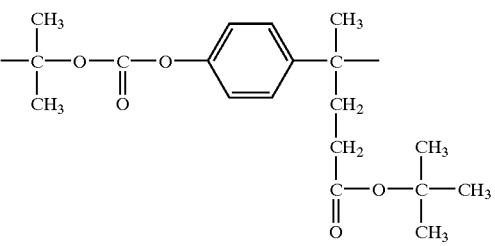
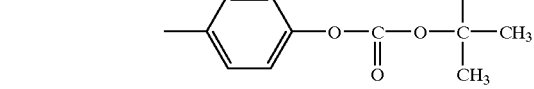
(DRR2)
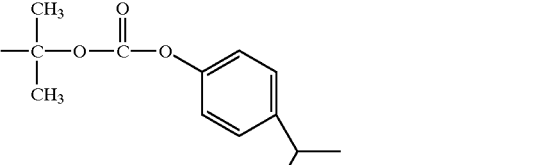
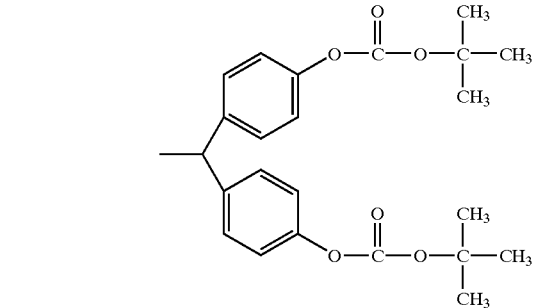

-continued

Crosslinker

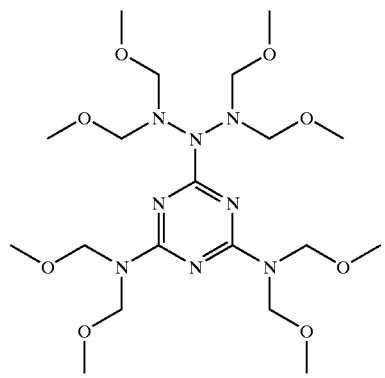

TABLE 1

| Example | Base resin | Photoacid generator | Basic compound | Dissolution regulator | Crosslinker | Sensitivity (mJ/cm²) | Resolution (μm) | Line edge roughness (nm) | Etching speed (Å/min) | Etched surface roughness (nm) |
|---|---|---|---|---|---|---|---|---|---|---|
| 1 | Polymer 1 (80) | PAG 2 (2) | n-butylamine (0.1) | — | — | 30 | 0.17 | 5 | 1620 | 5 |
| 2 | Polymer 2 (80) | PAG 2 (2) | n-butylamine (0.1) | — | — | 35 | 0.19 | 6 | 1610 | 4 |
| 3 | Polymer 3 (80) | PAG 2 (2) | n-butylamine (0.1) | — | — | 32 | 0.18 | 4 | 1600 | 4 |
| 4 | Polymer 4 (80) | PAG 2 (2) | n-butylamine (0.1) | — | — | 38 | 0.18 | 2 | 1580 | 3 |
| 5 | Polymer 5 (80) | PAG 2 (2) | n-butylamine (0.1) | — | — | 33 | 0.18 | 3 | 1610 | 5 |
| 6 | Polymer 6 (80) | PAG 2 (2) | n-butylamine (0.1) | — | — | 34 | 0.17 | 5 | 1610 | 4 |
| 7 | Polymer 7 (80) | PAG 2 (2) | n-butylamine (0.1) | — | — | 30 | 0.18 | 6 | 1630 | 5 |
| 8 | Polymer 8 (80) | PAG 2 (2) | n-butylamine (0.1) | — | — | 34 | 0.18 | 6 | 1610 | 4 |
| 9 | Polymer 9 (80) | PAG 2 (2) | n-butylamine (0.1) | — | Crosslinker (10) | 30 | 0.18 | 9 | 1520 | 8 |
| 10 | Polymer 10 (80) | PAG 2 (2) | n-butylamine (0.1) | — | Crosslinker (10) | 34 | 0.18 | 7 | 1520 | 8 |
| 11 | Polymer 11 (80) | PAG 2 (2) | n-butylamine (0.1) | — | Crosslinker (10) | 30 | 0.18 | 8 | 1530 | 9 |
| 12 | Polymer 1 (80) | PAG 1 (2) | n-butylamine (0.1) | — | — | 34 | 0.19 | 4 | 1610 | 5 |
| 13 | Polymer 1 (80) | PAG 3 (2) | n-butylamine (0.1) | — | — | 30 | 0.19 | 6 | 1620 | 5 |
| 14 | Polymer 1 (80) | PAG 2 (2) | n-butylamine (0.1) | DRR1 (10) | — | 34 | 0.18 | 6 | 1660 | 6 |
| 15 | Polymer 2 (80) | PAG 1 (2) | n-butylamine (0.1) | DRR2 (10) | — | 30 | 0.18 | 5 | 1650 | 7 |
| 16 | Polymer 2 (80) | PAG 2 (2) | Triethanol-amine (0.1) | — | — | 30 | 0.17 | 4 | 1630 | 5 |
| 17 | Polymer 2 (80) | PAG 2 (2) | TMMEA (0.2) | — | — | 30 | 0.17 | 4 | 1630 | 5 |
| 18 | Polymer 2 (80) | PAG 2 (2) | TMEMEA (0.3) | — | — | 30 | 0.17 | 3 | 1620 | 4 |

TABLE 2

| Comparative Example | Base resin | Photoacid generator | Basic compound | Dissolution regulator | Crosslinker | Sensitivity (mJ/cm²) | Resolution (μm) | Line edge roughness (nm) | Etching speed (Å/min) | Etched surface roughness (nm) |
|---|---|---|---|---|---|---|---|---|---|---|
| 1 | Polymer 12 (80) | PAG 2 (2) | n-butylamine (0.1) | — | — | 30 | 0.17 | 10 | 1750 | 10 |

TABLE 2-continued

| Compara-tive Example | Base resin | Photoacid generator | Basic compound | Dissolution regulator | Crosslinker | Sensitivity (mJ/cm$^2$) | Resolution ($\mu$m) | Line edge roughness (nm) | Etching speed (Å/min) | Etched surface roughness (nm) |
|---|---|---|---|---|---|---|---|---|---|---|
| 2 | Polymer 13 (80) | PAG 2 (2) | n-butylamine (0.1) | — | — | 35 | 0.19 | 9 | 1680 | 12 |
| 3 | Polymer 14 (80) | PAG 2 (2) | n-butylamine (0.1) | — | — | 32 | 0.18 | 10 | 1702 | 13 |
| 4 | Polymer 15 (80) | PAG 2 (2) | n-butylamine (0.1) | — | Crosslinker (10) | 30 | 0.24 | 20 | 1600 | 15 |
| 5 | Polymer 16 (80) | PAG 2 (2) | n-butylamine (0.1) | — | Crosslinker (10) | 34 | 0.24 | 22 | 1620 | 16 |
| 6 | Polymer 17 (80) | PAG 2 (2) | n-butylamine (0.1) | — | Crosslinker (10) | 30 | 0.24 | 23 | 1630 | 15 |
| 7 | Polymer 12 (80) | PAG 1 (2) | n-butylamine (0.1) | — | — | 34 | 0.19 | 8 | 1690 | 10 |
| 8 | Polymer 12 (80) | PAG 3 (2) | n-butylamine (0.1) | — | — | 30 | 0.19 | 9 | 1690 | 11 |
| 9 | Polymer 12 (80) | PAG 2 (2) | n-butylamine (0.1) | DRR1 (10) | — | 34 | 0.18 | 10 | 1710 | 12 |
| 10 | Polymer 12 (80) | PAG 1 (2) | n-butylamine (0.1) | DRR2 (10) | — | 30 | 0.18 | 9 | 1720 | 15 |
| 11 | Polymer 12 (80) | PAG 2 (2) | Triethanol-amine (0.1) | — | — | 30 | 0.17 | 10 | 1720 | 12 |
| 12 | Polymer 12 (80) | PAG 2 (2) | TMMEA (0.2) | — | — | 30 | 0.17 | 8 | 1710 | 14 |
| 13 | Polymer 12 (80) | PAG 2 (2) | TMEMEA (0.3) | — | — | 30 | 0.17 | 7 | 1730 | 13 |

It is evident from Tables 1 and 2 that the resist compositions using the dendritic polymers according to the invention are satisfactory in resolution and sensitivity. In particular, a comparison of Examples 9, 10 and 11 with Comparative Examples 4, 5 and 6 reveals that as compared with linear polymers, the negative resist compositions using the dendritic polymers have a high resolution as well as a reduced line edge roughness, reduced film thickness difference before and after etching, and reduced surface roughness after etching, indicating an excellent dry etching resistance.

Japanese Patent Application No. 11-082885 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A resist composition comprising as a base resin a dendritic or hyperbranched polymer of a phenol derivative having a weight average molecular weight of 500 to 10,000,000 wherein the polymer comprises recurring units (I) or (II) or both and recurring units (III) as shown below, the number of units (III) being 1 to 1,000, units (I):

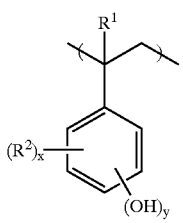

(1)

units (II)

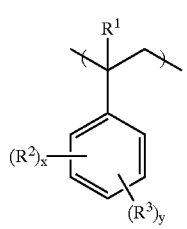

(2)

wherein $R^1$ is hydrogen or methyl, $R^2$ is independently a straight, branched or cyclic alkyl group of 1 to 30 carbon atoms or aryl group of 6 to 30 carbon atoms, $R^3$ is an $OR^4$ group, $R^4$ is an acid labile group or acid stable group, x is 0 or a positive integer, y is a positive integer, and the sum of x and y is up to 5, units (III):

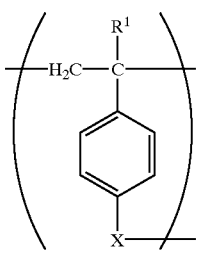

wherein $R^1$ is as defined above, and X is a valence bond or a straight or branched chain alkylene group of 1 to 10 carbon atoms which may contain a hydroxyl or carbonyl group.

2. The resist composition of claim 1 wherein the polymer has been prepared by living anion polymerization.

3. A chemical amplification positive resist composition comprising (A) a base resin constructed of the polymer of claim 1 which is little or no soluble in alkali, but becomes alkali soluble by reaction with acid, (B) an organic solvent, and (C) a photoacid generator.

4. The resist composition of claim 3 further comprising (D) a basic compound.

5. The resist composition of claim 3 further comprising (E) a dissolution regulator.

6. A chemical amplification negative resist composition comprising (A') a base resin constructed of the polymer of claim 1 which becomes little or no soluble in alkali by crosslinking with a crosslinker, (B) an organic solvent, (C) a photoacid generator, and (F) the crosslinker.

7. The resist composition of claim 6 further comprising (D) a basic compound.

8. A process for forming a resist pattern comprising the steps of:

(i) applying a resist composition according to claims 3 onto a substrate, (ii) heat treating the coated film and then exposing it to actinic radiation having a wavelength of up to 500 nm or electron beams through a photo mask, and (iii) optionally heat treating the exposed film and developing it with a developer.

9. The resist composition of claim 1, wherein $R^2$ is 1–8 carbon atoms.

10. The resist composition of claim 1, wherein $R^2$ is methyl, ethyl, propyl, isopropyl, n-butyl, isobutyl, tert-butyl, cyclohexyl, cyclopentyl, or phenyl.

11. The resist composition of claim 1, wherein $R^4$ is a group of formula (9), or a group of formula (10),

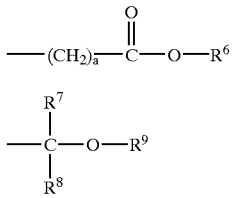

(9)

(10)

where $R^6$ is a tert-alkyl group of 4 to 40 carbon atoms, a trialkylsilyl group whose alkyl groups each have 1 to 6 carbon atoms, and an oxoalkyl group of 4 to 20 carbon atoms, and a is an integer of 0 to 10; and $R^7$ is hydrogen or a straight, branched or cyclic alkyl group having 1 to 10 carbon atoms, and $R^8$ and $R^9$ are, independently, a branched or cyclic alkyl group having 1 to 10 carbon atoms, or $R^8$ and $R^9$, taken together, form a ring.

12. The resist composition of claim 13, wherein the group of formula 10 is a 1-methoxyethyl, 1-ethoxyethyl, 1-n-propoxyethyl, 1-isopropoxyethyl, 1-n-butoxyethyl, 1-isobutoxyethyl, 1-sec-butoxyethyl, 1-tert-butoxyethyl, 1-tert-amyloxyethyl, 1-ethoxy-n-propyl, 1-cyclohexyloxyethyl, methoxypropyl, ethoxypropyl, 1-methoxy-1-methylethyl, 1-ethoxy-1-methylethyl, tetrahydrofuranyl or tetrahydropyranyl.

13. The resist composition of claim 1, wherein $R^4$ is an acid labile group of the formula Qa or Qb:

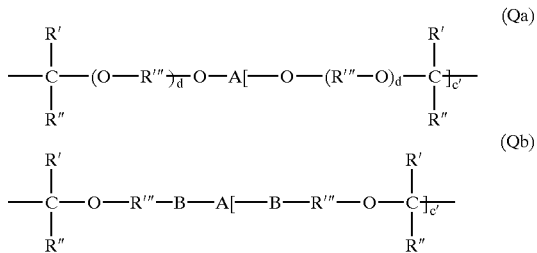

where

R' and R'' are each, independently, hydrogen or a straight, branched or cyclic alkyl group of 1 to 8 carbon atoms, or R' and R'', taken together, may form a ring, with the proviso that each of R' and R'' is a straight or branched alkylene group of 1 to 8 carbon atoms when they form a ring;

R''' is a straight, branched or cyclic alkylene group of 1 to 10 carbon atoms;

d is 0 or an integer of 1–10;

A is a c-valent aliphatic or alicyclic saturated hydrocarbon group, aromatic hydrocarbon group or heterocyclic group of 1 to 50 carbon atoms, which may have an intervening hetero atom and in which the hydrogen atom attached to a carbon atom may be partially replaced by a hydroxyl group, carboxyl group, acyl group or halogen atom;

B is —CO—O—, —NHCO—O— or —NHCONH—;

c is an integer of 2–8; and c' is an integer of 1–7.

14. A resist composition of claim 1, wherein at least one unit (I) or (II) is bonded to at least one unit (III) through the X group in unit (III).

* * * * *